United States Patent [19]

Kawakami

[11] Patent Number: 5,774,371

[45] Date of Patent: Jun. 30, 1998

[54] SEMICONDUCTOR INTEGRATED CIRCUIT AND LAYOUT DESIGNING METHOD FOR THE SAME

[75] Inventor: Yoshiyuki Kawakami, Osaka, Japan

[73] Assignee: Matsushita Electric Industrial Co., Ltd., Osaka, Japan

[21] Appl. No.: 509,937

[22] Filed: Aug. 1, 1995

[30] Foreign Application Priority Data

Aug. 3, 1994 [JP] Japan ..................................... 6-182286
Dec. 16, 1994 [JP] Japan ..................................... 6-313398

[51] Int. Cl.$^6$ ............................ H02B 1/20; H01L 23/482
[52] U.S. Cl. ......................... 364/491; 364/488; 364/490; 364/489; 395/250
[58] Field of Search .................................. 364/489–490, 364/491, 578; 395/250

[56] References Cited

U.S. PATENT DOCUMENTS

| | | | |
|---|---|---|---|
| 4,698,760 | 10/1987 | Lembach et al. | 364/490 |
| 5,218,551 | 6/1993 | Agrawal et al. | 364/491 |
| 5,237,514 | 8/1993 | Curtin | 364/490 |
| 5,274,568 | 12/1993 | Blinne et al. | 364/489 |
| 5,420,491 | 5/1995 | Minami | 304/491 |
| 5,452,228 | 9/1995 | Arakawa et al. | 364/489 |
| 5,481,209 | 1/1996 | Lim et al. | 326/93 |
| 5,521,837 | 5/1996 | Frankle et al. | 364/491 |
| 5,557,779 | 9/1996 | Minami | 395/500 |
| 5,564,022 | 10/1996 | Debnath et al. | 395/250 |
| 5,581,202 | 12/1996 | Yano et al. | 326/101 |

FOREIGN PATENT DOCUMENTS 4-269860   9/1992   Japan .
5-198674   8/1993   Japan .

OTHER PUBLICATIONS

Ren–Song Tsay, "Exact Zero Skew", Proc. IEEE International Conference on Computer Aided Design, 1991, pp. 336–339.

Masato Edahiro, "Delay Minimization for Zero–Skew Routing", Proc. IEEE International Conference on Computer Aided Design, 1993, pp. 563–566.

Primary Examiner—Kevin J. Teska
Assistant Examiner—Herbert McNair
Attorney, Agent, or Firm—McDermott, Will & Emery

[57] ABSTRACT

Functional blocks and block external wiring are roughly laid out in a semiconductor integrated circuit. The positions of cells in the functional blocks, block internal wiring and the block external wiring are determined through calculation of delay time as a sum of block external delay time and block internal delay time, so that clock skew of each cell is within a limited range and the delay time is within a desired range. Wiring patterns are formed in accordance with the determined wiring. In determining the positions of the cells in the functional blocks and the block internal wiring, a template corresponding to a clock tree is formed, and the cells and the wires are laid out based on the clock tree structure on the template. Since the delay time can be adjusted, the respective cells of the respective functional blocks in one semiconductor integrated circuit or respective cells of respective semiconductor integrated circuits in one system can be synchronized one another. Since the layout of the semiconductor integrated circuit is designed by using a clock tree in a top-down fashion, the layout can be quickly designed without increasing an occupied area.

15 Claims, 16 Drawing Sheets

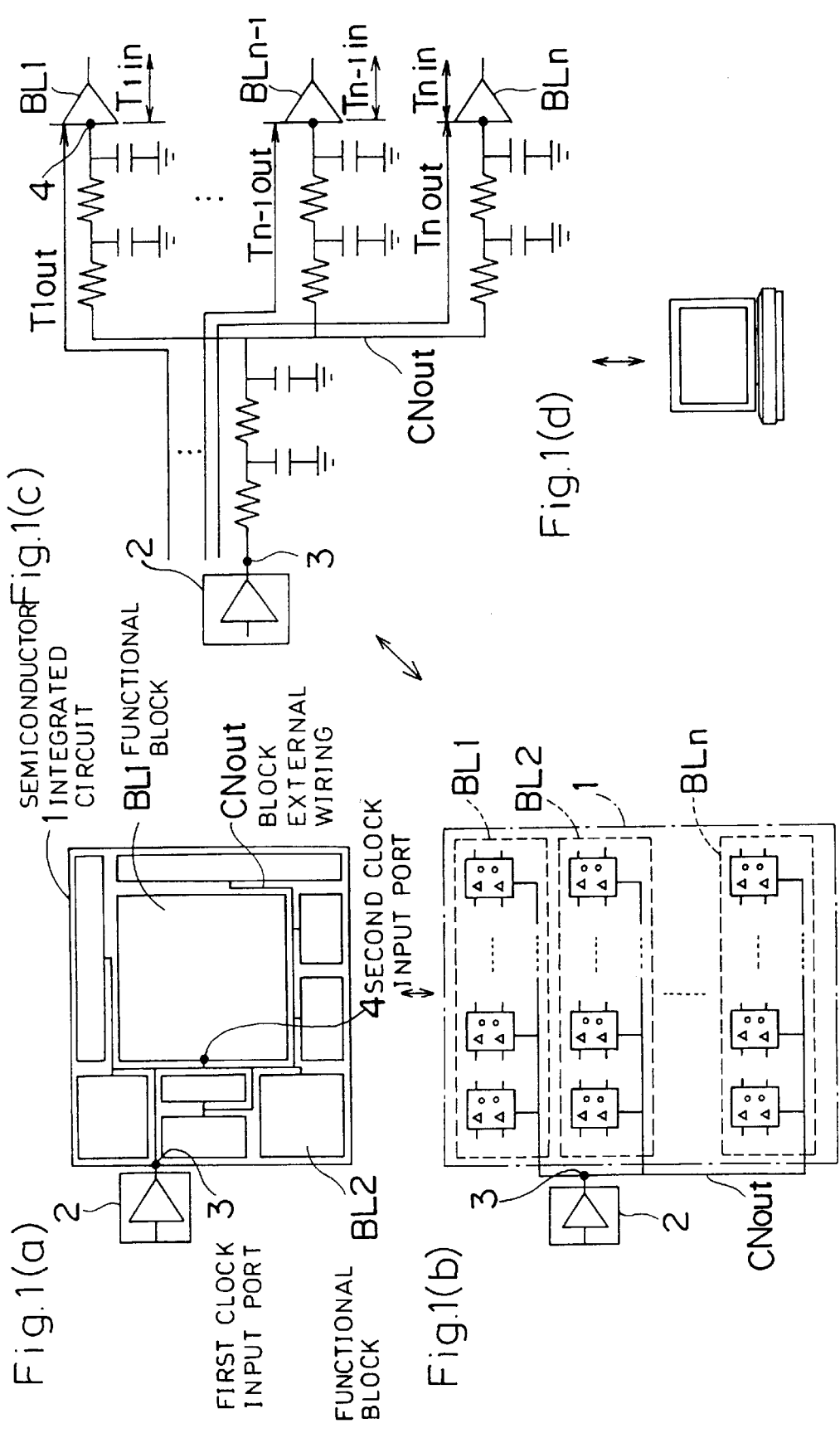

NUMBER OF CLOCK BUFFERS:7

MAXIMUM NUMBER OF
FLIP-FLOPS : 8

NUMBER OF CLOCK BUFFERS:4

MAXIMUM NUMBER OF
FLIP-FLOPS : 9

CLOCK SKEW = 0

CLOCK SKEW > 0

SEMICONDUCTOR INTEGRATED CIRCUIT AND LAYOUT DESIGNING METHOD FOR THE SAME

BACKGROUND OF THE INVENTION

The present invention relates to a layout designing method for a semiconductor integrated circuit, and more particularly, it relates to a layout designing method for clock wires for transferring clock signals and cells driven by the clock signals.

As a layout designing method for a semiconductor integrated circuit (LSI), gate array designs (or sea of gate designs) and standard cell designs are known. In these designs, basic logic cells such as a NAND and a NOR, and compound cells including a combination of the basic logic cells are disposed on a semiconductor chip in the form of an array, and the cells are interconnected with their terminals in accordance with a logical interconnecting demand, thereby forming an LSI. These designs are automatically performed, and various kinds of systems for the automatic design have been developed.

In association with development of fabrication technology for semiconductor integrated circuits, semiconductor integrated circuits of embedded array cell designs, which is attained by combining the gate array design and the standard cell design, have been proposed. In the embedded array cell design, part or all of the circuits in a semiconductor integrated circuit are included in a plurality of functional blocks, such as previously designed macro blocks and newly designed blocks of the standard cell mode, and the respective functional blocks are disposed on a semiconductor chip. An area excluding the functional blocks is defined as a gate array design region, where circuits excluding those contained in the functional blocks and wires excluding those contained in the functional blocks are formed. Thus, a semiconductor integrated circuit is constructed by the embedded array cell design. Since circuits can be optionally formed in an area excluding the functional blocks, it is advantageously possible to add an extra circuit or modify the existing circuits comparatively easily before a wiring process.

Recently developed semiconductor integrated circuits are so highly integrated that an entire system for a desired function can be mounted on one semiconductor chip. As the degree of integration is thus increased, the design period of a semiconductor integrated circuit is also increased. This also goes for layout design of semiconductor integrated circuits, and the amount of time required for the layout design are also exponentially increasing. As a result, huge time and efforts are required to layout an entire semiconductor integrated circuit at a stretch. Therefore, a hierarchical designing method is generally adopted, in which a semiconductor integrated circuit is divided into several functional blocks as described above, each functional block is dependently designed, and the functional blocks are interconnected in the end.

In the meantime, a frequency of a clock signal for synchronously driving respective cells in a semiconductor integrated circuit is also increasing. The operation speed of a semiconductor integrated circuit is limited by clock skew, that is, a phase difference among clock signals transferred to the respective cells. Similarly, the operation speed of the entire system is limited by clock skew of respective semiconductor integrated circuits contained in the system. High integration of a semiconductor integrated circuit results in an increased number of cells driven by a clock signal such as a flip-flop. In addition, since clock signals supplied to the respective functional blocks should be synchronized with one another. Thus, a wiring method for supplying a clock signal to each cell has become more and more significant.

As a method for minimizing the clock skew, a clock tree is formed. In this method, as is shown in FIGS. 16a and 16b, wiring extending from a clock signal input port to a group of flip-flops to be simultaneously operated are formed as a clock tree in each functional group. A difference of signal delay time to travel from the root of the tree to each flip-flop (i.e., skew of a clock tree) is suppressed to be smaller than a given time difference. As is shown in FIG. 16a, three functional blocks BL1, BL2 and BL3 are disposed in a semiconductor integrated circuit 1 surrounded by pads 11. The functional blocks BL1, BL2 and BL3 include clock trees CT1, CT2 and CT3 corresponding to wiring structures (clock nets) for transferring clock signals, respectively. FIG. 16b is an enlarged diagram of part of the clock tree CT1 formed in the functional block BL1. On a position corresponding to a leaf of the clock tree CT1 is disposed a flip-flop 20, and on a position corresponding to an internal node between tapping points 23 on the clock tree CT1 is disposed (interposed) a clock buffer 21. Such a clock buffer is connected to another clock buffer or a flip-flop with a wire, thereby forming the clock tree CT1. In such a clock tree, the decrease of clock skew results in higher operation speed of the entire circuit, and hence, it is important to close the clock skew to 0.

A Conventional method for attaining exact zero clock skew in a clock tree is disclosed in "Proc. IEEE International Conference on Computer Aided Design, 1991, pp. 336–339" (Conventional Example 1). In the construction of a clock tree by this method, a binary tree is constructed in a manner designated as zero skew merge, namely, constructed successively from a flip-flop in a bottom-up fashion so that the resultant tree can always attain skew of 0 (which state is designated as zero skew). One of the most significant points in constructing one tree from two trees so as to attain the zero skew is in the tapping point 23 (shown in FIG. 16b). The tapping point 23 corresponds to a point where the root for the two merged trees is placed (to which a clock buffer is connected). When the tapping point 23 is defined as a point which allows delay time from the tapping point 23 to the respective flip-flops 20, corresponding to the leaves, to be equal, the resultant clock tree can achieve exact zero skew. In the method of Conventional Example 1, flip-flops and buffers are first disposed, and then, they are wired to one another in a bottom-up fashion while always ensuring zero skew, thereby constructing a binary tree.

When a clock tree is constructed in this manner, it is necessary to always ensure zero skew. Therefore, poor wiring results in a clock tree with a large wiring length. Thus, the delay time from the root of the clock tree to its leaves is increased, and as a result, a period of one clock cycle is longer. This results in a low operation speed of the circuit.

In order to overcome this problem, efficient algorithms have been recently developed, one of which is disclosed in "Proc. IEEE International Conference on Computer Aided Design, 1993, pp. 563–566" (Conventional Example 2). This algorithm uses a delay time estimation formula as an objective function to be minimized, and simultaneously optimizes a wire width.

In the standard cell design (or the gate array design) in which a clock tree is used and a semiconductor integrated circuit is divided into functional blocks, examples of layout designing procedures are as follows:

1. Basic logic cells are disposed in the form of an array based on a logic schema for a desired function. At this point, flip-flops are disposed so as to be spread over the entire functional block.

2. While constructing a clock tree in a bottom-up fashion from a group of the flip-flops in a net of wires for transferring clock signals (clock net), the positions of clock buffers and global wiring in the clock tree are determined.

3. In the remaining net, global wiring is determined.

4. In the clock net, detailed wiring is performed in accordance with the global wiring so as to attain zero skew.

5. In a net excluding the clock net, detailed wiring is performed in accordance with the global wiring.

As a method for constructing a clock tree in a different manner from that described above, a clock tree can be constructed in a top-down fashion while hierarchically partitioning a semiconductor integrated circuit into regions, as is disclosed in Japanese Laid-Open Patent Publication No. 6-282603 (Conventional Example 3). In this method, the above-mentioned procedures 1 and 2 are simultaneously performed. While conducting hierarchical area partition in a top-down fashion, clock buffers are interposed, basic logic cells are laid out and a clock tree is constructed simultaneously. This method has an advantage that the locations of the basic logic cells excluding flip-flops can be optimized, taking the clock tree structure into consideration.

The aforementioned methods are generally performed on an entire chip or on each functional block.

The design of a semiconductor integrated circuit is hierarchically conducted in general. Therefore, when the methods are adopted in each functional block, it is significant to synchronize clock signals in the respective functional blocks. Examples of known layout methods for synchronizing clock signals supplied to the respective functional blocks include the following:

(A) Block external clock wires each extending from a clock source to one of the functional blocks are freely laid out without being limited by block external wiring channels, so as to have an equal length from the clock source to a clock input port (clock terminal) of each functional block;

(B) At the center of a semiconductor integrated circuit is disposed a clock signal distributor, which is connected to a clock source with one clock wire, and clock wires are formed between the clock signal distributor and the clock terminals including the related functional blocks so as to be equal in length.

For example, Japanese Laid-Open Patent Publication No. 5-198674 (Conventional Example 4) discloses one of such methods.

In the methods of Conventional Examples 1 and 2, basic logic cells including flip-flops and clock buffers are disposed priorly to the formation of a clock tree. Therefore, it is possible to construct a clock tree with zero skew. However, it is disadvantageously difficult to minimize delay time in the clock tree or suppress it to be a desired time. Accordingly, there is the possibility that the operations of the respective semiconductor integrated circuits of the respective functional blocks cannot be synchronized. When a system includes a plurality of semiconductor integrated circuits, there is the possibility that the operations of the respective semiconductor integrated circuits cannot be synchronized.

In the method of Conventional Example 3, since groups of flip-flops are hierarchically partitioned, it is difficult to minimize delay time in a clock tree or suppress it to be a desired time. Therefore, there is the possibility that the operations of semiconductor integrated circuits in one system cannot be synchronized as in Conventional Examples 1 and 2.

Furthermore, when clock skew is actually zero as is aimed by the methods of Conventional Examples 1, 2 and 3, a large number of flip-flops are simultaneously driven, resulting in a large current being allowed to momentarily flow (i.e., a peak current is increased). Therefore, depending upon a power supplying state, there is the possibility that the flip-flops cannot be appropriately operated. Specifically, even when the clock skew of the respective logic cells is designed to be 0, the operation time of the respective cells are actually slightly shifted owing to deviation in the fabrication process or the like in a semiconductor integrated circuit including a small number of logic cells such as flip-flops. Because of this slight shift, malfunction is seldom caused by the simultaneous operations of a large number of logic cells. However, since the scale of a semiconductor integrated circuit or a system has been recently become very large, and the frequency of a clock signal is increased, the number of logic cells simultaneously operated can possibly be increased. Therefore, there is the possibility of the malfunction owing to the momentary excessive current flow.

In addition, in the methods of Conventional Examples 1, 2 and 3, the clock net is generally interconnected simultaneously with other nets of cells that are not supplied with clock signals (i.e., the wiring layer that can be used for the clock net is the same as that for the other nets). Therefore, in the construction of a large scaled and complicated clock tree, the wire length can be uselessly elongated for several reasons such that the wiring for the clock net should be detoured because of the wiring for the other nets.

Furthermore, when functional blocks are disposed on a semiconductor chip and a clock tree is constructed for clock wiring by the method of Conventional Example 4, there is a restriction that wires from the clock source to the clock terminals of the respective functional groups should have an equal length. In order to keep the restriction, it is necessary to provide exclusive clock wires so as to avoid the failure of the other nets. For example, in a semiconductor chip having three wiring layers, first and second wiring layers are used for forming wiring for general signals and power supply, and a third wiring layer is used for the clock signal wiring. In this case, since a general signal wire cannot be formed in the third wiring layer, the chip area is enlarged as compared with the case where the third layer can be used also for general signals. In a double-layered semiconductor integrated circuit, it becomes difficult to accurately adjust clock skew when a clock net and another net are routed by two layers, for the following reason: since a clock net and another net are disposed in the same wiring layer, in order to avoid interference between the clock net and the other net, it becomes occasionally difficult to allow the wires from the clock source to the clock terminals of the respective functional blocks to have the same length. Therefore, after disposing the functional blocks and wires for the clock net, it is sometimes necessary to vary the size of a transistor in a clock buffer to ultimately adjust clock skew. In this case, when the size of a transistor in the clock buffer in the functional block is varied, it is necessary to re-design the layout of the functional block. This largely increases the time of the layout design, which offsets the meaning of this method.

SUMMARY OF THE INVENTION

First objective of the invention is providing a designing method for layout of a semiconductor integrated circuit that can attain smooth synchronized operation of an entire system including a large number of such circuits, by providing means for easily adjusting delay time in the semiconductor integrated circuit to be within a desired time range.

A second objective of the invention is providing a designing method for layout of a semiconductor integrated circuit by which a clock tree can be easily constructed.

A third objective of the invention is providing a method of adjusting delay time of clock signals in an entire semiconductor chip and optimizing clock skew therein without re-designing the layout of functional blocks.

In order to achieve the first objective, in a first designing method for layout of a semiconductor integrated circuit, a semiconductor integrated circuit including a plurality of elements is divided into a plurality of cells each including at least one element, and the plurality of cells are divided into a plurality of functional blocks. This method comprises a first step of roughly disposing the functional blocks in the semiconductor integrated circuit; a second step of roughly determining block external wiring from a first clock input port of the semiconductor integrated circuit to second clock input ports of the functional blocks; a third step of determining the positions of the cells, block internal wiring and the block external wiring in the functional blocks through calculation of delay time of each of a first type of cells as a sum of block external delay time from the first clock input port to the second clock input port of each of the functional blocks and block internal delay time from the second clock input port to each of the first type of cells of the functional blocks, so that clock skew defined as a difference in the delay time among the first type of cells is within a limited range and that the delay time of each of the first type of cells is within a desired range; and a fourth step for forming wiring patterns in accordance with the wiring determined in the third step.

In this manner, the delay time of the first type of cells in the semiconductor integrated circuits can be adjusted to be within a given range. Therefore, not only in a functional block but also in a semiconductor integrated circuit, the operation of the elements of the cells in the respective functional blocks can be synchronized with a clock signal. In a system constructed with a plurality of such semiconductor integrated circuits, the operation of the elements of the cells in the respective semiconductor integrated circuits can be synchronized with a clock signal.

In one aspect of the first designing method for the layout of a semiconductor integrated circuit, in the second step, merely part of the block external wiring up to a final branching point before reaching the second clock input port of each of the functional blocks can be roughly determined. In this case, the method can further comprise a step, after the third step and before the fourth step, of finely adjusting the positions of the functional blocks.

In this manner, the block external delay time can be more accurately adjusted.

In another aspect of the first designing method for the layout of a semiconductor integrated circuit, in the first step, the functional blocks are temporally disposed in the semiconductor integrated circuit, and under this condition, the positions of the functional blocks are roughly determined so that the delay time of the clock signal from the first clock input port to each of the logic cells can be within the desired range.

This method enables the functional blocks to be disposed in positions that allows the delay time to be adjusted afterward, and hence, it is possible to prevent an occasion from occurring that the initial positions of the functional blocks cannot allow the adjustment of the delay time after designing the layout. Therefore, it is possible to prevent the number of layout procedures from increasing due to undesired redesign by changing the positions of the functional blocks.

In still another aspect of the first designing method for the layout of a semiconductor integrated circuit, in the third step, the delay time of the respective cells are preferably distributed to have a plurality of different values within the desired range.

In this manner, it is possible to prevent a large number of cells from actually being simultaneously operated in the semiconductor integrated circuit even when the semiconductor integrated circuit has a large scale and a high clock frequency. Therefore, the malfunction of flip-flops due to momentary increase of a current can be avoided.

In still another aspect of the first designing method for the layout of a semiconductor integrated circuit, the third step can include the steps of forming a template corresponding a clock tree having such a structure that a wire led from the second clock input port of each functional block is successively branched in a plurality of directions to ultimately reach each of the first type of cells; disposing the first type of cells in the functional blocks in accordance with the clock tree structure and disposing the second type of cells in a space area excluding an area where the first type of cells are disposed; roughly determining wiring among the cells in accordance with a logical interconnecting demand; adjusting the delay time from the second clock input port to each of the first type of cells on the clock tree to have desired values; and forming wiring patterns in the functional blocks in accordance with the wiring determined in the previous step.

In this manner, clock nets can be easily formed in the respective functional blocks by using a clock tree structure. Furthermore, since the structures of the clock nets are previously determined, the positions of the second type of cells can be easily optimized, and interference with another net can be easily prevented. Therefore, the number of the layout procedures can be largely decreased.

In this aspect, the step of forming the template can include steps of determining the number of branching of the clock tree; determining the size of the clock tree; determining the positions of tapping points on the clock tree; and disposing cells for adjusting delay time on the clock tree.

Thus, when the template is formed, an area for disposing the second type of cells in the functional blocks can be secured, and the delay time and clock skew are set to have values approximate to desired values. Therefore, the procedures in the subsequent steps can be smoothly performed. As a result, the efficiency of the layout design can be largely improved.

In still another aspect, the step of adjusting the delay time of the respective cells can be conducted by changing at least one of an output driving ability of a cell positioned at an intermediate node on the clock tree, the width of a wire in the clock tree, and the position of a tapping point on the clock tree.

The first designing method for layout of a semiconductor integrated circuit can further comprise a step of disposing cells for adjusting the block external delay time so as to be positioned previously to the second clock input ports and outside of the functional blocks.

Thus, the block external delay time and the clock skew can be adjusted by merely varying the sizes of the cells for adjusting the block external delay time such as a clock buffer, and there is no need to re-design the layout in the functional blocks. Therefore, the increase of the number of the layout procedures due to the resizing of the clock buffer, etc. can be avoided.

In order to achieve the second objective of the invention, in a second designing method for layout of a semiconductor integrated circuit, a semiconductor integrated circuit including a plurality of elements is divided into a plurality of cells each including at least one element, and the plurality of cells are classified into a first type of cells receiving clock signals from a clock input port and a second type of cells excluding the first type of cells. This method comprises the steps of forming a template corresponding to a clock tree having such a structure that a wire led from the clock input port is successively branched in a plurality of directions to ultimately reach each of the first type of cells; disposing the first type of cells in the semiconductor integrated circuit in accordance with the clock tree structure formed in the previous step and disposing the second type of cells in a space area excluding an area where the first type of cells are disposed; roughly determining wiring among the cells in accordance with a logical interconnecting demand; adjusting delay time from the clock input port to the respective first type of cells on the clock tree to ultimately have desired values; and forming wiring patterns in the semiconductor integrated circuit in accordance with the wiring determined in the previous step.

In this manner, the cell placement and the wiring in a clock net can be determined in a top-down fashion by using the clock tree structure corresponding to the template, and the delay time and the clock skew can be easily adjusted. Therefore, the respective cells of the respective functional blocks can be synchronized with a clock signal. Thus, the number of the layout procedures can be largely decreased, and there is no possibility of increase of an area occupied by the semiconductor integrated circuit as otherwise occurs in a semiconductor integrated circuit of a bottom-up mode.

In one aspect of the second designing method for the layout of a semiconductor integrated circuit, the step of forming the template can include the steps of determining the number of branching in the clock tree; determining the size of the clock tree; determining the positions of tapping points on the clock tree; and disposing cells for adjusting the delay time on the clock tree.

In still another aspect of the second designing method for the layout of a semiconductor integrated circuit, the step of adjusting the delay time of the cells can be performed by varying at least one of an output driving ability of a cell positioned at an intermediate node on the clock tree, the width of a wire in the clock tree and the position of a tapping point on the clock tree.

In still another aspect of the second designing method for the layout of a semiconductor integrated circuit, in the step of forming the template, the template can be formed through calculation of the delay time of clock signals from the clock input port to the first type of cells, so that the delay time of all the cells are within the desired range.

Thus, since the delay time are retained within the desired range when the template is formed, large shift of the delay time would not be caused even if the delay time are varied from initial estimated values in the subsequent steps. Therefore, it is possible to definitely prevent an occasion from occurring in which the layout is required to be re-designed.

In still another aspect of the second designing method for the layout of a semiconductor integrated circuit, in the step of ultimately adjusting the delay time, it is preferred that the delay time of clock signals from the clock input port to the respective cells are substantially equally distributed to have a plurality of different values within the desired range.

In still another aspect of the second designing method for the layout of a semiconductor integrated circuit, in the step of disposing the cells, it is preferred that flip-flops are disposed at tips of the clock tree as the first type of cells, cells for adjusting the delay time are disposed as the first type of cells at internal nodes between the respective tapping points on the clock tree, and then the second type of cells are disposed.

Thus, since the structure of the clock net is defined before disposing the second type of cells, virtual wiring lengths of wires for the second type of cells can be easily optimized and interference with the clock net can be easily avoided.

In order to achieve the third objective, in a third designing method for layout of a semiconductor integrated circuit, a semiconductor integrated circuit including a plurality of elements is divided into a plurality of cells each having at least one element, the plurality of cells are classified into a first type of cells receiving clock signals and a second type of cells excluding the first type of cells, and the plurality of cells are divided into a plurality of functional blocks. This method comprises the steps of forming a block internal clock net in each of the functional blocks; disposing cells for adjusting delay time so as to be positioned previously to a second clock input port for supplying the clock signal to each of the functional blocks and outside of the functional blocks; disposing the functional blocks in the semiconductor integrated circuit; and forming a block external clock net extending from a first clock input port of the semiconductor integrated circuit to the second clock input port of each of the functional blocks through the cells for adjusting the delay time.

In one aspect of the third designing method for the layout of a semiconductor integrated circuit, the step of forming the block internal clock net can include the steps of forming a template corresponding to a clock tree having such a structure that a wire led from the second clock input port to each of the functional blocks is successively branched in a plurality of directions to ultimately reach each of the first type of cells; disposing the first type of cells in the functional blocks in accordance with the clock tree structure and disposing the second type of cells in a space area excluding an area where the first type of cells are disposed; roughly determining wiring among the cells in accordance with a logical interconnecting demand; adjusting delay time from the second clock input port to the first type of cells on the clock tree to ultimately have desired values; and forming wiring patterns in the functional blocks in accordance with the wiring determined in the previous step.

Accordingly, even when the delay time and clock skew in the respective functional blocks are largely different from one another at the final stage of the layout design, it is possible to adjust the delay time and clock skew to have the desired values merely by changing the transistor sizes of the cells for adjusting the delay time, such as a clock buffer and an inverter, positioned outside of the functional blocks. Therefore, the respective cells of the respective functional blocks can be synchronized with a clock signal. Thus, even when a clock net and another net are interconnected with common wiring layers in a top-down fashion, the delay time and clock skew can be easily adjusted at the final stage. Thus, the designing efficiency can be improved and the number of wiring layers can be decreased by adopting the top-down mode.

Furthermore, in order to achieve the third objective, a semiconductor integrated circuit of the invention includes a plurality of elements mounted on a semiconductor chip, a plurality of functional blocks each including a plurality of elements and a block external area excluding the functional blocks. This semiconductor integrated circuit comprises a first clock input port for inputting a clock signal to the semiconductor integrated circuit, a second clock input port for inputting a clock signal to each of the functional blocks, block external clock wires formed in the block external area for transferring a clock signal from the first clock input port to the second clock input port of each of the functional blocks, and cells for adjusting delay time interposed on the block external clock wires so as to be positioned previously to the second clock input port of each of the functional blocks.

Thus, the delay time of the respective cells can be easily set within a desired range by using the cells for adjusting the delay time, during the layout design of the semiconductor integrated circuit. Therefore, the respective cells of the respective functional blocks can be synchronized with a clock signal. Thus, the efforts required for the production can be largely decreased, resulting in large decrease of a production cost of the semiconductor integrated circuit.

In one aspect, the semiconductor integrated circuit can further comprise other wiring members in addition to the clock wires, and the clock wires and the other wiring members can be mixedly formed in common wiring layers.

As a result, the wiring structure can be simplified, thereby largely decreasing the production cost.

In still another aspect, the block external area is formed in a gate array region where transistors are spread over, and the cells for adjusting the delay time can be formed by using the transistors in the gate array region.

Thus, the cells for adjusting the delay time such as a clock buffer can be formed by using previously formed transistors, and hence, the sizes of the cells for adjusting the delay time can be easily varied.

BRIEF DESCRIPTION OF THE DRAWINGS

FIGS. 1a through 1d are diagrams showing the concept of a clock design according to a first embodiment;

DETAILED DESCRIPTION OF THE INVENTION

[Embodiment 1]

Figure 2A:
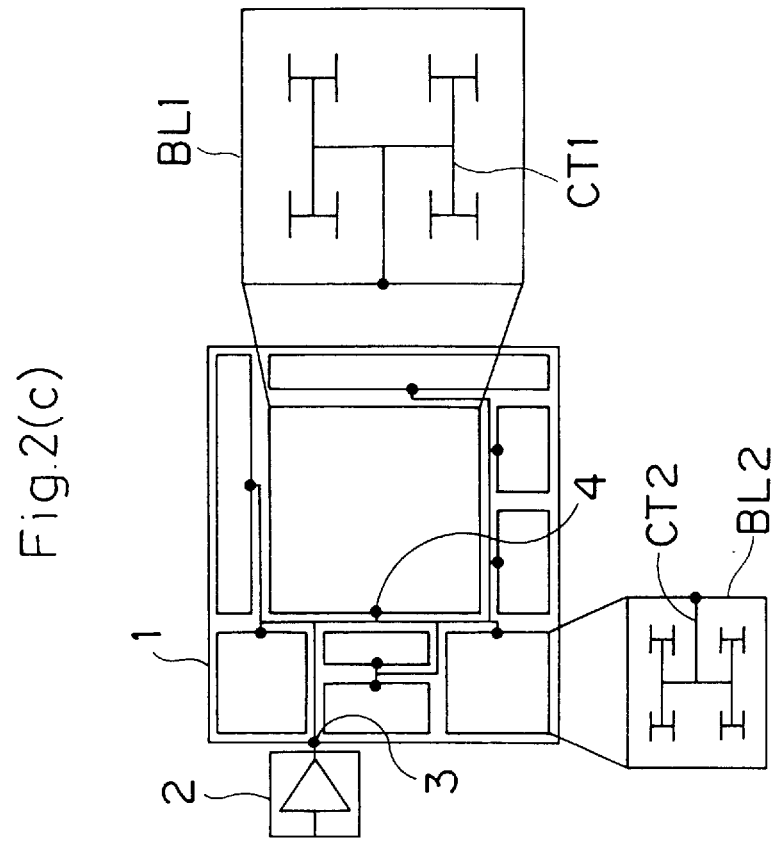
FIGS. 2a through 2c are diagrams showing the procedures in clock net design according to the first embodiment.

Embodiment 1 will now be described referring to FIGS. 1a through 1d and 2a through 2c.

FIGS. 1a through 1d are diagrams showing the concept of a clock design according to this embodiment. As is shown in FIG. 1a, a semiconductor integrated circuit 1 is divided into a plurality of functional blocks BL1, BL2, . . . and BLn, the positions of which are temporally determined. Then, it is possible to temporally determine the position of a block external wiring CNout (block external clock net) for transferring clock signals, which are input to the semiconductor integrated circuit 1 from a clock source 2 via a first clock input port 3, to a second clock input port 4 of each of the functional blocks BL1, BL2, . . . and BLn. Blank frames in the semiconductor integrated circuit 1 shown in FIG. 1a correspond to the functional blocks BL1, BL2, . . . and BLn shown in FIG. 1b. As is shown in FIG. 1b, each of the functional blocks BL1, BL2, . . . and BLn in the semiconductor integrated circuit 1 contains a large number of logic cells.

Wires included in the block external clock net CNout are electrically a set of delay elements each including a combination of a resistance and a capacitance as is shown in FIG. 1c. Therefore, block external delay time T1out, . . . , Tn-1out and Tnout from the first clock input port 3 to the respective functional blocks BL1, . . . , BLn-1 and BLn are temporally determined (whereas the diameter of each wire is assumed to be equal). The functional blocks BL1, . . . , BLn-1 and BLn can be regarded as buffers having delay time of T1in, . . . Tn-1in and Tnin, respectively. Therefore, it is possible to roughly estimate the delay time T1, T2, . . . , Tn-1 and Tn of clock signals from the first clock input port 3 to the respective logic cells in the functional blocks BL1, BL2, . . . , BLn-1 and BLn. At this point, it is estimated whether or not the delay time T1, T2, . . . , Tn-1 and Tn in the respective functional blocks are within a desired time range. Simultaneously, it is also estimated whether or not clock skew is within a limited time range. The clock skew being 0 means T1=T2=...=Tn-1=Tn. When it can be enforced that the delay time T1, T2, . . . , Tn-1 and Tn are all within the desired time range, the functional blocks are started to be laid out on the temporally determined positions and the clock net in each functional block is started to be designed. When it cannot be enforced that the delay time T1, T2, . . . , Tn−1 and Tn are within the desired time range, the delay time T1, T2, . . . , Tn−1 and Tn in the respective logic cells are estimated again after changing the positions of the functional blocks BL1, BL2, . . . , BLn−1 and BLn. Thus, the temporal layout design is continued until the delay time are within the desired time range and the clock skew is within the limited time range. When the temporal layout design is completed, delay time is calculated in detail with a simulator (such as SPICE) with regard to the clock net with the complete temporal layout design.

Next, the clock designing method of this embodiment will be described in detail. First, the block external clock net CNout is formed as is shown in FIG. 2a. At this point, the functional blocks BL1, BL2, . . . , etc. are temporally laid out in the semiconductor integrated circuit 1, and the position of a portion of the block external clock net CNout up to a final branching point 5 before reaching the functional blocks BL1, BL2, . . . , and BLn is determined, with another portion from the final branching point 5 to each of the functional blocks BL1, BL2, . . . , and BLn temporally determined. Thus, a space for slightly shifting the functional blocks BL1, BL2, . . . , and BLn at the last stage is reserved. Then, block external delay time T1out, T2out, . . . , and Tnout of clock signals from the first clock input port 3 to the second clock input ports 4 of the functional blocks BL1, BL2, . . . and BLn are calculated.

Figure 2B:
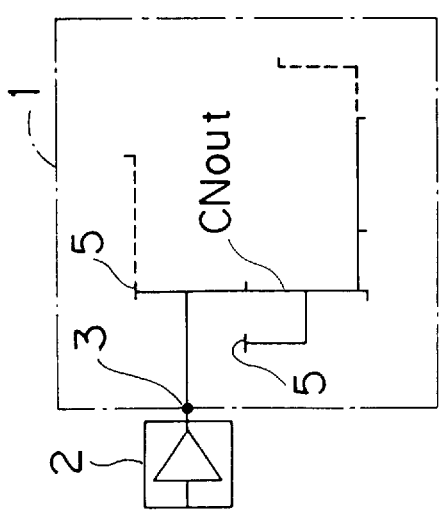

Then, as is shown in FIG. 2b, clock trees CT1, CT2, . . . and CTn corresponding to wiring for transferring clock signals in the functional blocks BL1, BL2, . . . and BLn are constructed in a clock tree structure described below. A method for constructing the clock tree will be described referring to Embodiment 2. At this point, block internal delay time T1in, T2in, . . . and Tnin in the functional blocks BL1, BL2, . . . and BLn are calculated.

Figure 2C:
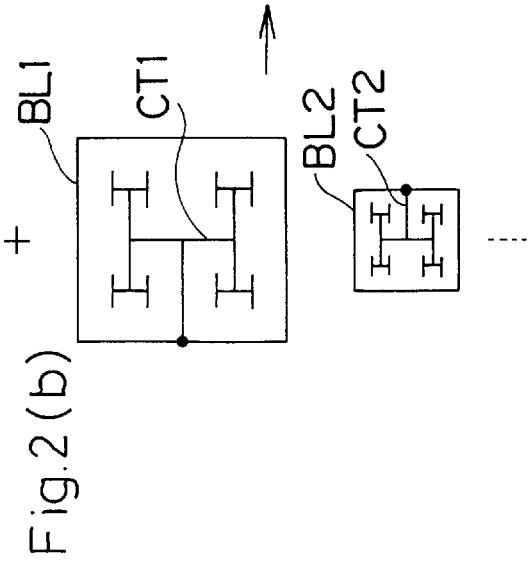

Finally, as is shown in FIG. 2c, under the condition that the functional blocks BL1, BL2, . . . and BLn are contained in the semiconductor integrated circuit 1, delay time T1 (=T1out+T1in), T2 (=T2out+T2in), . . . , and Tn (=Tnout+Tnin) in the respective logic cells in the functional blocks are calculated. At this point, while controlling the delay time T1, T2, . . . and Tn in the respective logic cells to be distributed to have a plurality of different delay time values, the wire widths in the clock net are varied, or clock buffers are disposed, if necessary. In this case, although the clock skew is not 0 but is divided into several groups having different values, the values are controlled to be within a limited range sufficient for not causing synchronizing failure in the respective logic cells.

In the case where the delay time are divided into several groups in this manner, when they are divided by using each of the functional blocks BL1, BL2, . . . and BLn as one unit, the delay time of clock signals to the respective logic cells in one functional block are equal to one another. This is of course effective, but the delay time can be divided by using each logic cell as one unit. Specifically, it is possible to design the delay time of clock signals to different groups of logic cells in one functional block to be different from one another.

In the present layout designing method, a wiring in the outside of the functional blocks, i.e., the block external clock net, is first formed, and then the entire clock net is formed so as to retain the delay time T1, T2, . . . , and Tn of clock signals from the first clock input port 3 to the respective logic cells within the desired time range. Thus, the delay time of the clock signals to the logic cells can be adjusted to have desired time values. Therefore, the respective cells of the respective functional blocks can be synchronized with a clock signal. Thus, even when a large scaled system is constructed from a plurality of semiconductor integrated circuits, the operations of the semiconductor integrated circuits can be accurately synchronized with one another.

It is not always necessary to initially design the clock net of the block external clock net CNout merely up to the final branching point 5 before reaching the functional blocks BL1, BL2, . . . and BLn as described above. It is possible to initially determine the design of the clock net up to the second clock input port 4 of each functional block. However, when the clock net is initially designed up to the final branching point 5 in the block external clock net and then the positions of the functional blocks are exactly adjusted for adjusting the delay time in the final wiring procedure, as described in this embodiment, it is possible to exactly and accurately adjust the delay time, in particular, and it is also possible to enlarge the adjustable time range.

In this embodiment, the clock net is temporally designed before the actual design of the layout of a clock net. But it is not always necessary to start from the temporal design of a clock net, and the layout of the clock net can be actually designed from the beginning. However, when, at the stage of the temporal design of the clock net, the appropriate positions of the functional blocks BL1, BL2, . . . and BLn are roughly determined so that the delay time T1, T2, . . . and Tn be within a desired time range in the temporal designing procedure, it is possible to avoid undesired position move of the functional blocks afterward which can be required because the initial positions cannot allow the delay time or the clock skew to have desired time values.

Furthermore, it is not always necessary to divide the delay time into several groups as in this embodiment, but the delay time to the respective logic cells can be the same, i.e., the clock skew can be 0. However, when the delay time to the logic cells are divided into different groups having different values in the designing procedure, even in a large scaled semiconductor integrated circuit having a high clock frequency, it is possible to effectively prevent malfunction due to a lack of power otherwise caused by the momentary simultaneous operation of a large number of the logic cells.

Furthermore, in this embodiment the block external clock net CNout is not designed using a clock tree, but it is possible to design the block external net CNout by using a clock tree.

[Embodiment 2]

Embodiment 2 will now be described referring to FIGS. 3 through 11.

Figure 3:
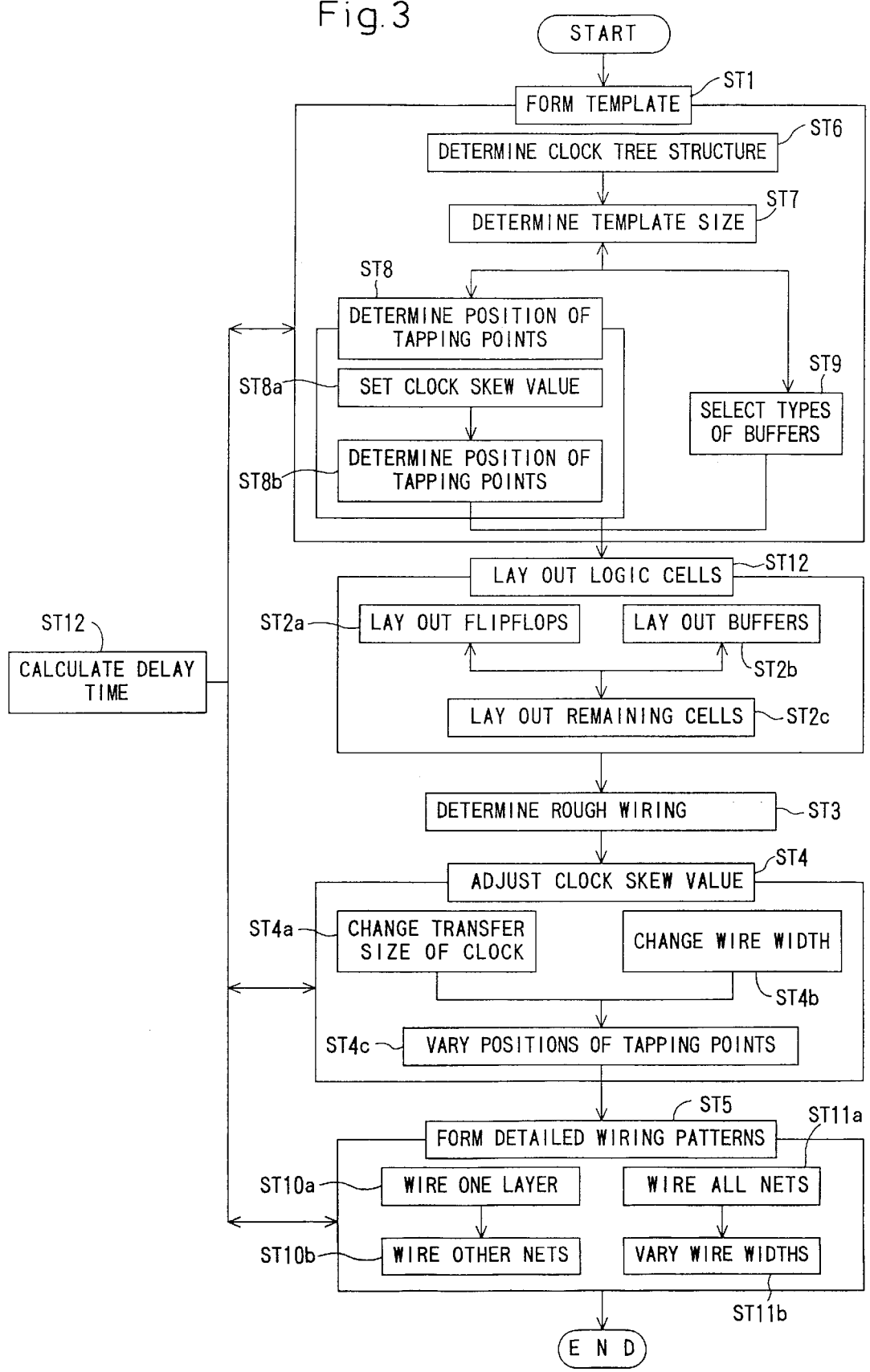
FIG. 3 is a flowchart showing the procedures of layout design according to a second embodiment.

FIG. 3 is a flowchart for the entire procedures of a layout designing method according to Embodiment 2.

Figure 4:
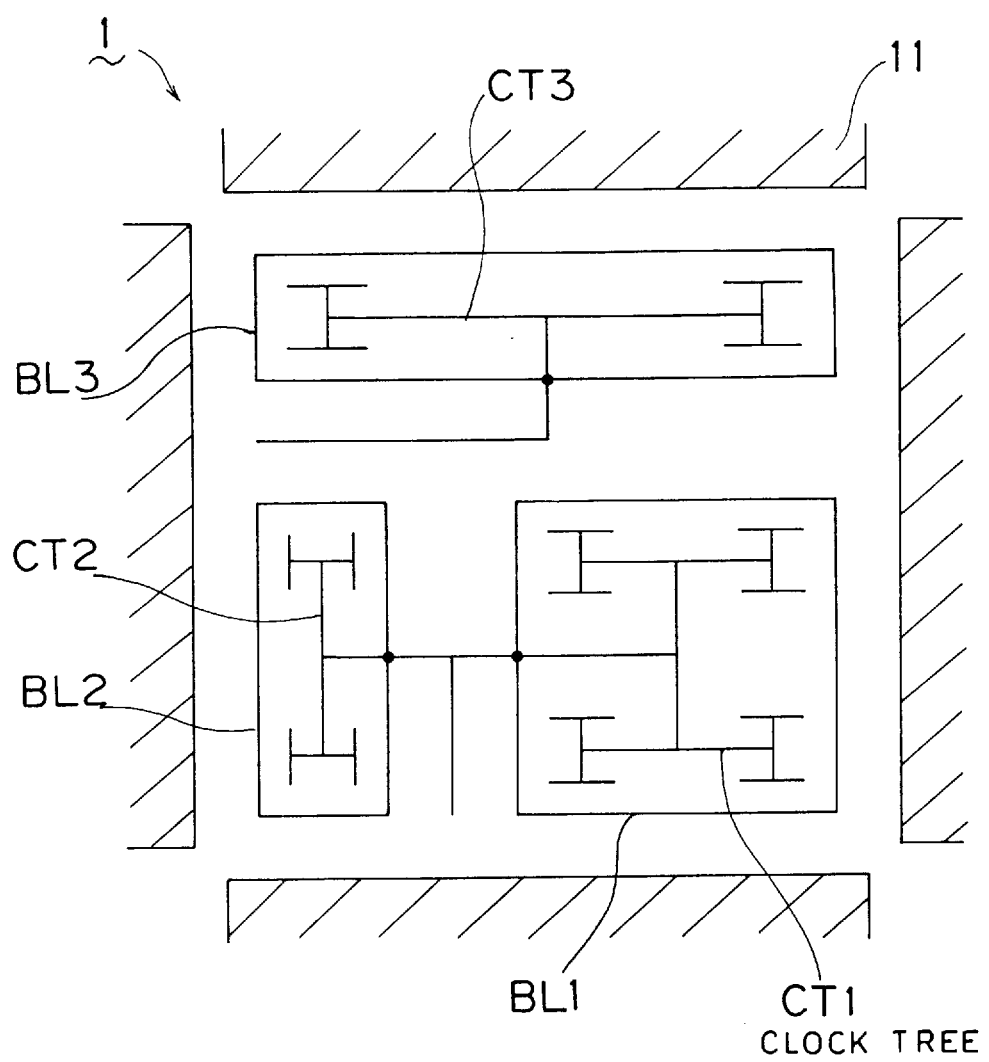
FIG. 4 is a schematic block diagram of the configuration of a semiconductor integrated circuit according to the second embodiment.

FIG. 4 shows the configuration of a semiconductor integrated circuit 1 of this embodiment, which includes three functional blocks BL1, BL2 and BL3 in an area surrounded by pads 11. In the semiconductor integrated circuit 1 are constructed a block external clock net CNout for transferring clock signals supplied from a clock source (not shown) to the functional blocks BL1, BL2 and BL3, and clock trees CT1, CT2 and CT3 corresponding to wiring for transferring the clock signals to basic logic cells in the functional blocks BL1, BL2 and BL3.

FIGS. 5 through 8 illustrate the change of the configuration of the semiconductor integrated circuit 1 when wires are successively provided in the functional block BL1 of FIG. 4 in accordance with the procedures of FIG. 3.

Now, merely the outline of the procedures will be described in accordance with the flowchart of FIG. 3 referring to FIGS. 5 through 8.

Figure 5A:
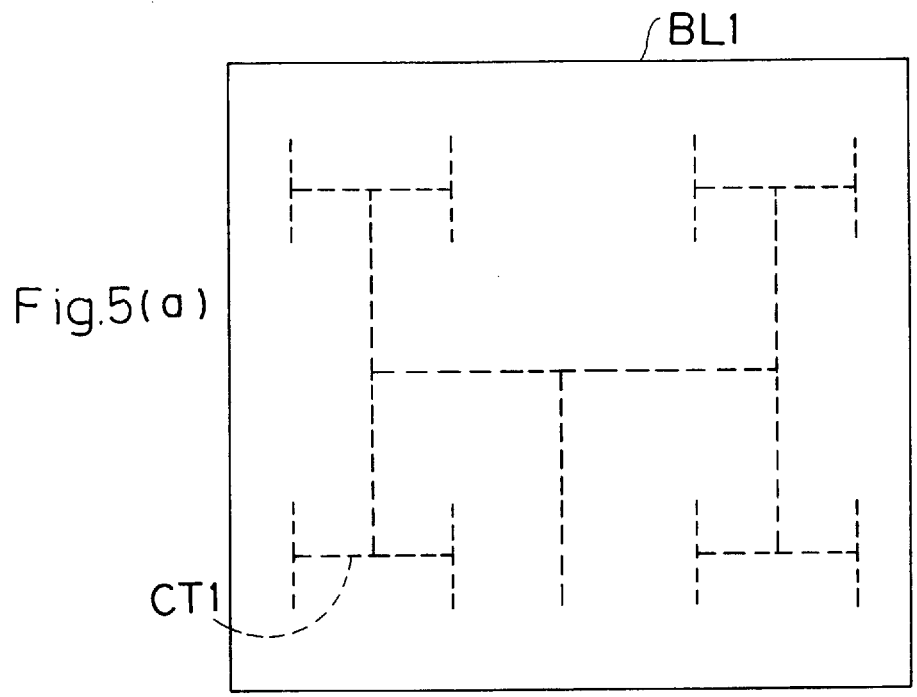
FIGS. 5a and 5b are block diagrams showing layout design procedures according to the second embodiment after the determination of a structure of a clock tree and the positions of tapping points, respectively.
Figure 5B:
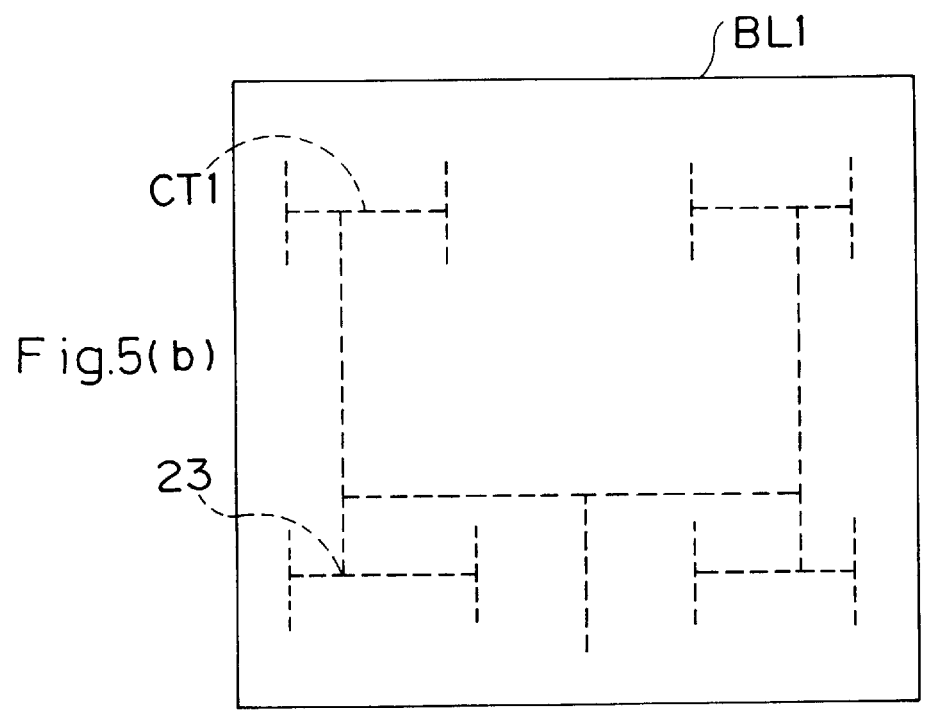

In step ST1, a template corresponding to the structure of the clock tree CT1 in the functional block BL1 is formed as is shown in FIG. 5a so as to set delay time of the clock tree (i.e., time required for a clock signal to travel from the root of the tree to each leaf) within a limited time range. In this embodiment, a template for the clock tree CT1 is constructed in order to determine the positions of flip-flops and clock buffers, that is, a first type of cells priorly disposed on the clock tree CT1, and to determine the size of the clock tree CT1. What is important at this point is that delay time from the root of the clock tree to the flip-flops corresponding to its leaves (which is block internal delay time Tin in this embodiment) can be varied depending upon not only the size of a transistor in a clock buffer but also the size of the clock tree itself. When this property is appropriately used, the delay time in the clock tree can be exactly adjusted, and a space area can be secured, if necessary. In this case, the delay time is calculated in step ST12, and the template is formed based on the result of the calculation. For example, when the position of a tapping point 23 is shifted from the center between the logic cells as is shown in FIG. 5b, the respective logic cells are allowed to have different delay time, thereby adjusting a clock skew value.

Figure 6A:
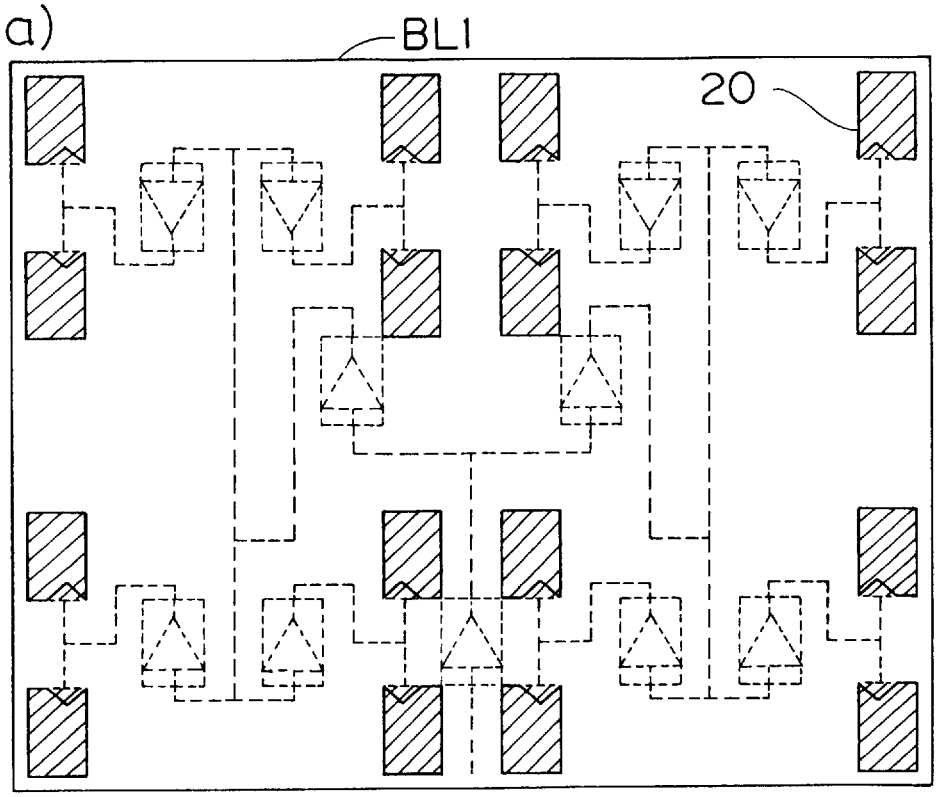
FIGS. 6a and 6b are block diagrams showing layout design procedures according to the second embodiment after disposing flip-flops and subsequently clock buffers, respectively.
Figure 6B:
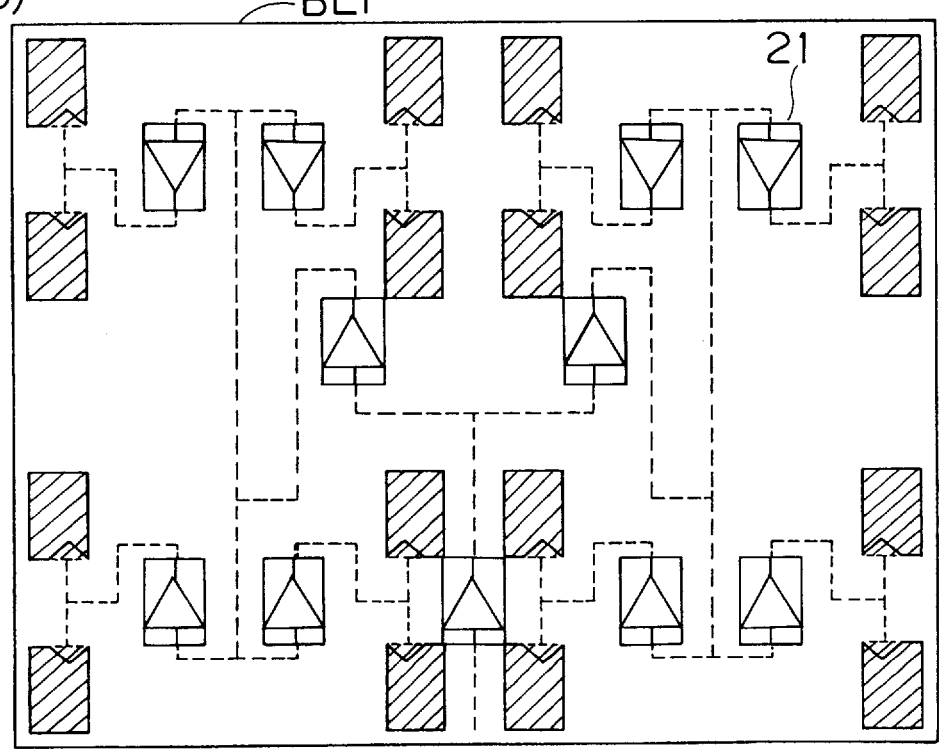
Figure 7A:
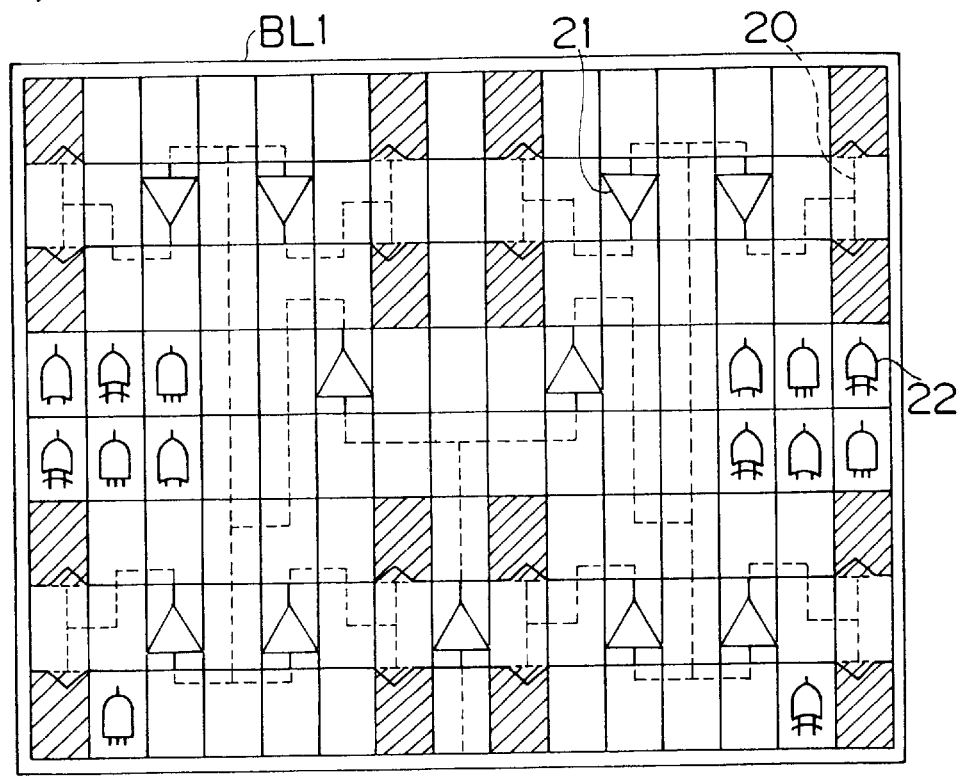
FIGS. 7a and 7b are block diagrams showing layout design procedures according to the second embodiment after disposing second type of logic cells and varying wire width, respectively.

Next, all the logic cells are laid out in step ST2. At this point, flip-flops 20 and clock buffers 21, that is, the first type of logic cells, are priorly laid out in the clock tree CT1 as is shown in FIGS. 6a and 6b. Then, remaining second type of logic cells 22 are disposed as is shown in FIG. 7a.

Then, wires are roughly provided in step ST3. Although the structure of the clock tree is already constructed in step ST1, global wiring in the clock tree is determined in detail in step ST3. Specifically, it is determined around which part in the semiconductor integrated circuit 1 are provided with wires, and also in a net excluding the clock net (i.e., wiring for transferring signals excluding a clock signal), global wiring is determined. At this point, taking the structure of the clock tree into consideration, the global wiring is determined so as to minimize the congestion of the wires and also minimize the wiring length.

Next, the clock skew value is finely adjusted in step ST4 based on the positions of the flip-flops 20 and the clock buffers 21. At this point, fine adjustment is made by changing the sizes of transistors in the clock buffers 21, changing the wire widths in routes 30, 31 and 32 shown in FIG. 7b, and changing the positions of the tapping points. In step ST4, the delay time in the clock tree is not adjusted. This is because the delay time cannot be largely changed (adjusted) at this stage. Instead of changing the sizes of the transistors in the clock buffers, different types of clock buffers can be used.

Figure 8:
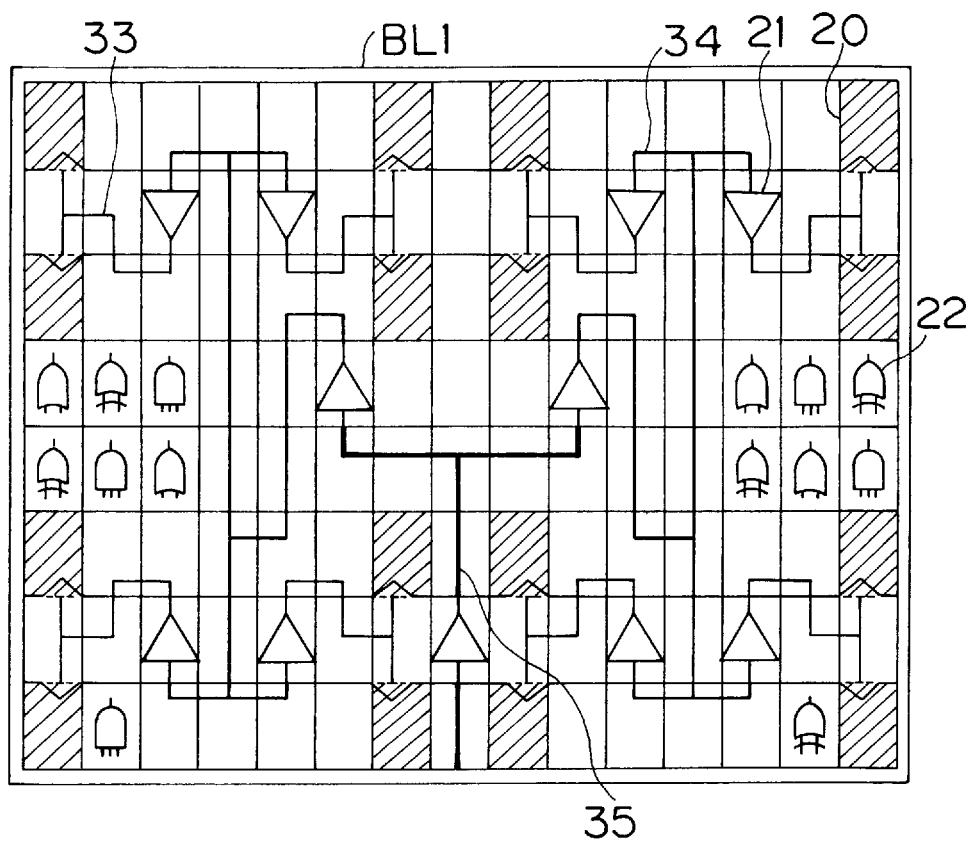
FIG. 8 is a block diagram showing the completion of the layout design according to the second embodiment.

Finally, detailed wiring patterns in all the nets are formed in step ST5 as is shown in FIG. 8. At this point, one of the following two methods can be selected:

(1) One exclusively wiring layer is used for the clock net, and other wiring layers are used for the other nets; and (2) All the wiring layers are commonly used for all the nets.

In the method (2), wiring can attain a clock skew value different from a desired one depending upon the relationship between the clock net and the other nets, and hence, the wire widths should be more exactly adjusted.

Since a template is used to determine the structure of the clock tree in this manner, it is possible to flexibly and easily control the determination of the optimal positions of the flip-flops and the clock buffers, the clock skew and the delay time in the clock tree. As a result, the layout design for a semiconductor integrated circuit having a high clock signal frequency can be conducted more easily than in the conventional method. Furthermore, since the structure of the clock tree is previously determined, it is also possible to optimize the layout positions of other logic cells and to prevent interference between the clock net and signal net, thereby decreasing the congestion of the wires.

In this embodiment, the clock tree includes a buffer as a clock buffer at the intermediate node on the clock tree. However, when there are an even number of levels of buffers between the root of the clock tree and its leaf, it is also possible to interpose an inverter for inverting a logic value instead of a buffer, because an inverter can retain the logic value of an input signal in this case.

Now, specific contents of steps ST1 through ST5 in the flowchart of FIG. 3 will be described.

Figure 9A:
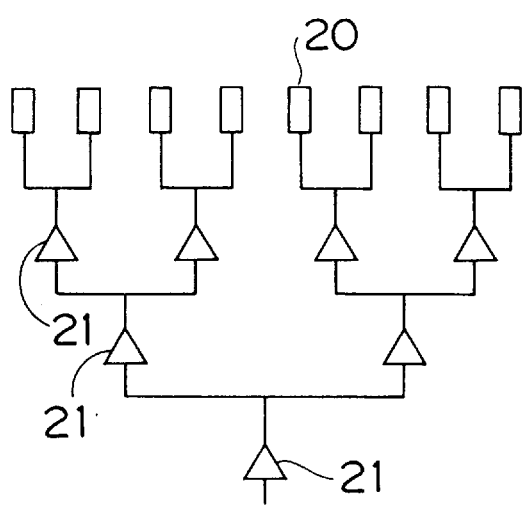
FIGS. 9a and 9b are block diagrams of the layout design procedures according to the second embodiment showing a difference in the number of cells between a binary tree and a trinary tree.
Figure 9B:
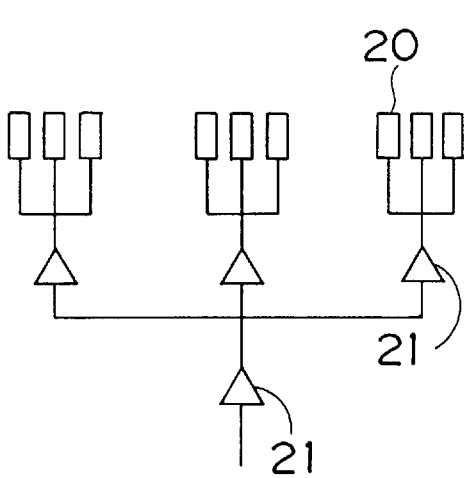

Step ST1 is roughly divided into four minor steps as is shown in FIG. 3. In step ST6, the structure of the clock tree is determined. At this point, either a binary clock tree shown in FIG. 9a or a trinary clock tree shown in FIG. 9b can be selected. In the binary clock tree of FIG. 9a, when it is assumed that a buffer interposing level in the clock tree is 3, the maximum number of the flip-flops 20 that can be laid out is eight, and it is necessary to interpose seven clock buffers 21, as is shown in the upper portion of FIG. 9a. The buffer interposing level herein means a number of levels of buffers required for tracing from a clock buffer 21 serving as the root for supplying a clock signal to the respective flip-flops 20. When the buffer interposing level is 3 and a trinary clock tree is desired to be constructed, the maximum number of the flip-flops 20 that can be laid out is nine, and four clock buffers 21 are required to be interposed, as is shown in FIG. 9b. In this manner, as the number of branching in a tree is increased, the number of buffers to be interposed is decreased and the maximum number of flip-flops is increased. This is not necessarily advantageous in chip area because the number of wires required between the buffers and between a flip-flop and a buffer is also increased.

The number of branching in one clock tree can be limited to one type, such as a binary tree or a trinary tree, or one tree can include several types of branching numbers.

In this embodiment, the clock tree CT1 is constructed to have the binary tree structure shown in FIG. 5a.

Figure 10A:
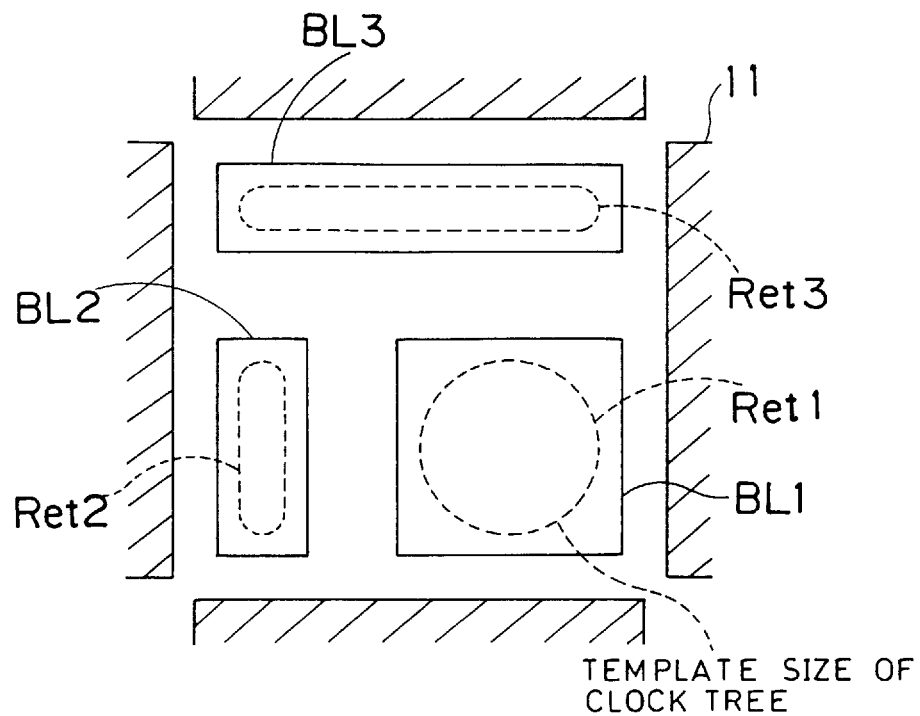
FIGS. 10a through 10c are block diagrams of the layout design procedures according to the second embodiment illustrating the size relationship between a functional block and a clock tree and a difference between a large clock tree and a small one.
Figures 10B, 10C:
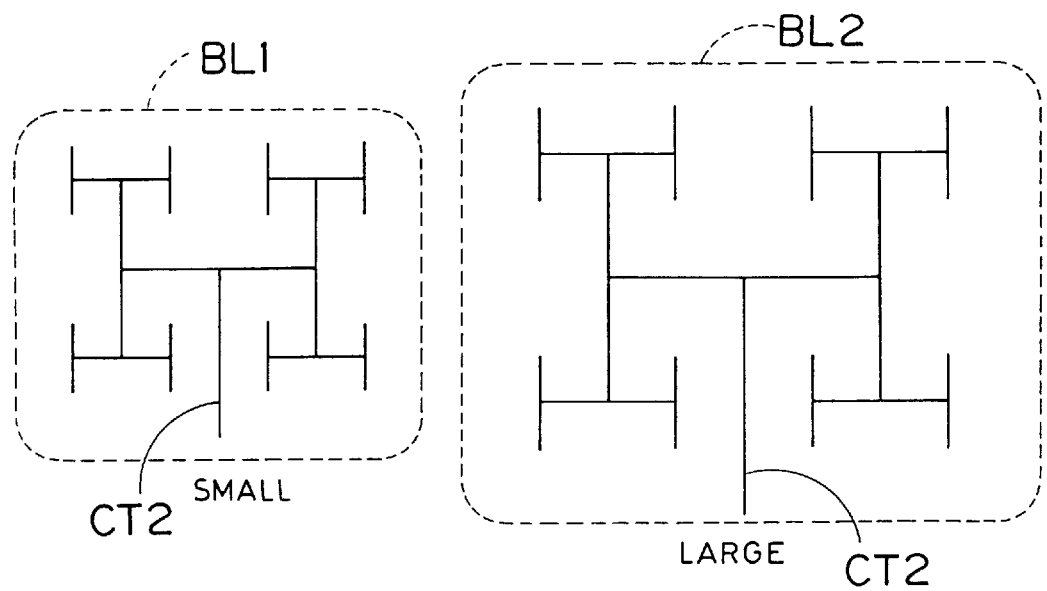

Next, in step ST7, the size of the template, i.e., the size of the clock tree CT1 constructed in the functional block BL1, is determined. FIG. 10a shows template regions Ret1, Ret2 and Ret 3 respectively formed in the functional blocks BL1, BL2 and BL3. The template regions Ret1, Ret2 and Ret3 correspond to the sizes of the clock trees CT1, CT2 and CT3 constructed in the functional blocks BL1, BL2 and BL3, respectively. FIG. 10b shows the structure with a small template size, and FIG. 10c shows the structure with a large template size. These structures are geometrically analogy, but have different lengths of wires between clock buffers and between a flip-flop and a buffer. The difference in the wire length varies the delay time of the wire, in such a manner that a shorter wire has shorter delay time. Specifically, the clock tree having the template size of FIG. 10b has shorter total delay time (i.e., the maximum delay time from the clock buffer at the root to the flip-flops). However, when the size of a clock tree is excessively small, a large number of flip-flops are gathered in a small area, resulting in increasing an area occupied by the wires because of the congestion of the wires. As a result, the final area of the functional blocks and the chip area can be disadvantageously increased.

In this embodiment, the clock tree CT1 is constructed to occupy the entire functional block BL1 as is shown in FIGS. 5a and 5b.

Figure 11A:
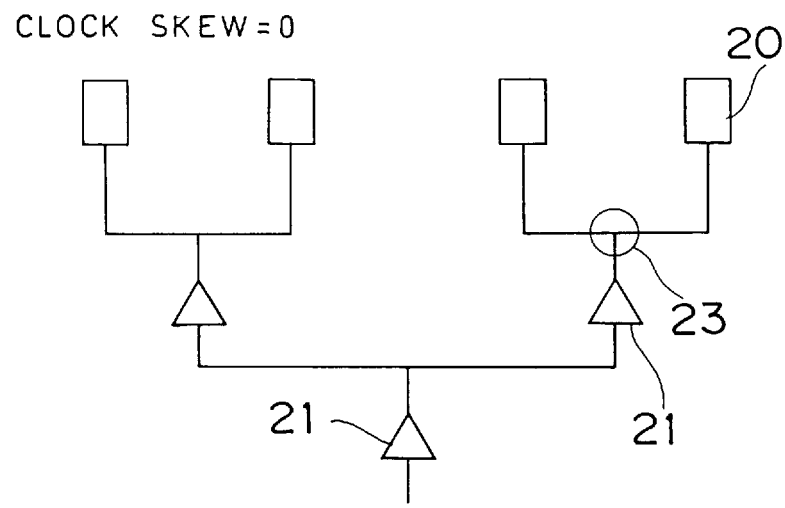
FIGS. 11a and 11b are block diagrams of the layout design procedures illustrating the positions of tapping points for attaining zero or positive clock skew.
Figure 11:
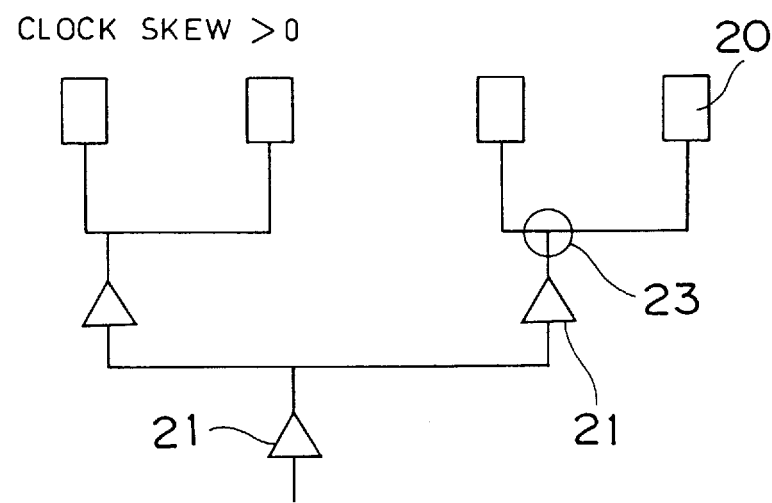

Next, the positions of the tapping points 23 are determined so as to adjust the magnitude of clock skew in step ST8. In the case shown in FIG. 11a, the tapping points 23 are provided so as to balance the clock tree, wherein the clock skew is 0 exactly. In the case shown in FIG. 11b, the tapping points 23 are slightly shifted leftward in the drawing, and the clock tree is unbalanced. In this case, since the lengths of the wires between the clock buffers 21 and between a clock buffer and a flip-flop are different, the clock skew is larger than 0. In order to attain positive clock skew, step ST8 includes two substeps ST8a and ST8b as shown in the flowchart of FIG. 3. Specifically, a clock skew value is set to be smaller than a previously set maximum allowable skew value in step ST8a, and then, the position of a tapping point is determined so as to satisfy the determined clock skew value in step ST8b.

At this point, the clock skew value is calculated by using the result of calculation of the delay time performed in step ST12. In the binary tree, a clock skew value is a difference between delay time in the left branch and that in the right branch. Thus, the position of each tapping point 23 is determined so as to satisfy the clock skew value set in the previous step ST8a. In a trinary tree, the clock skew value can be similarly calculated.

Although the size of the clock tree and the positions of the tapping points 23 have been determined in the aforementioned steps, the delay time of the clock tree is not uniquely defined because the types of the clock buffers 21 interposed in the clock tree have not been determined. In order to define the delay time, the types of the interposed clock buffers 21 are selected in step ST9. In general, a clock buffer 21 with a large driving ability is operated at a high speed and that with a small driving ability is operated at a low speed. The types of the respective clock buffers 21 are selected based on the result of the calculation of the delay time performed in step ST12 so as to attain the required delay time value in the clock tree. At this point, an occasion can arise that any combination of the types of the clock buffers cannot meet the demanded delay time value in the clock tree. In such a case, the procedure returns to step ST7, where the size of the template is re-determined with the types of the clock buffers 21 fixed.

The foregoing steps determine the size of the template satisfying the demanded clock skew value and delay time value in the clock tree, the types of the interposed clock buffers 21 and the positions of the tapping points 23.

FIG. 5b shows the functional block BL1 after the determination of the positions of the tapping points 23 on the clock tree CT1.

Next, groups of logic cells including the flip-flops and the clock buffers are laid out in the circuit in step ST2. At this point, a first type of logic cells to be disposed on the clock tree are priorly laid out. Specifically, the flip-flops 20 are laid out on the clock tree CT1 in the functional block BL1 as is shown in FIG. 6a in step ST2a, and then, the clock buffers 21 are laid out on the clock tree CT1 as is shown in FIG. 6b in step ST2b, whereas it makes no difference whether the flip-flops 20 are first laid out or the clock buffers 21 are first laid out.

Then, the second type of logic cells (remaining cells) 22, which do not directly receive a clock signal, are laid out in an area in the functional block BL1 excluding the clock tree CT1 in step ST2c. FIG. 7a shows the functional block BL1 after disposing the second type of logic cells. Since the wire width and the like are not determined at this stage, the wires are shown with broken lines in this drawing.

At this point, since the flip-flops 20 and the clock buffers 21 are previously disposed, the second type of logic cells 22 can be laid out taking the structure of the clock tree CT1, i.e., a block internal clock net, into consideration. Therefore, it is possible to optimize the positions of the second type of logic cells 22, while considering the minimization of wire length and the decrease of the congestion of the wires. However, an occasion can arise that a layout design cannot be achieved in this step alone. In such a case, the procedure returns to step ST2a or ST2b, wherein the positions of the flip-flops 20 or the clock buffers 21 are improved with the second type of logic cells 22 laid out. Then, the second type of logic cells 22 can be re-disposed in step ST2c. At this point, by replacement the logic cells iteratively until the optimal layout is attained, i.e., for example, the estimated wire length is minimized and the congestion of the wires is minimized, interference between the wires in the clock net and those in the other nets can be reduced, resulting in wiring with small congestion (high density).

Next, the global wiring in all the nets are determined in step ST3. Since the structure of the clock tree has been already determined, it is possible to determine wiring connected with the other nets excluding the clock net, while retaining the determined clock skew and delay time in the clock tree.

Figure 12:
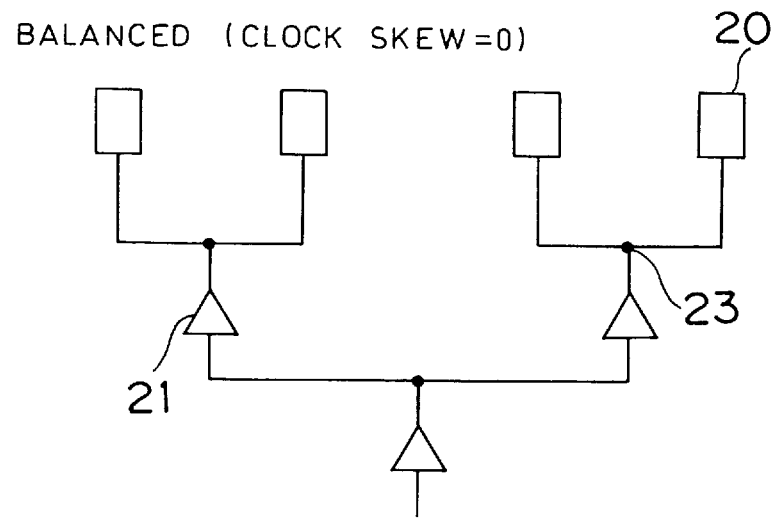
FIGS. 12a and 12b are block diagrams of the layout design procedures illustrating the setting of wire width for attaining zero or positive clock skew.
Figure 12:
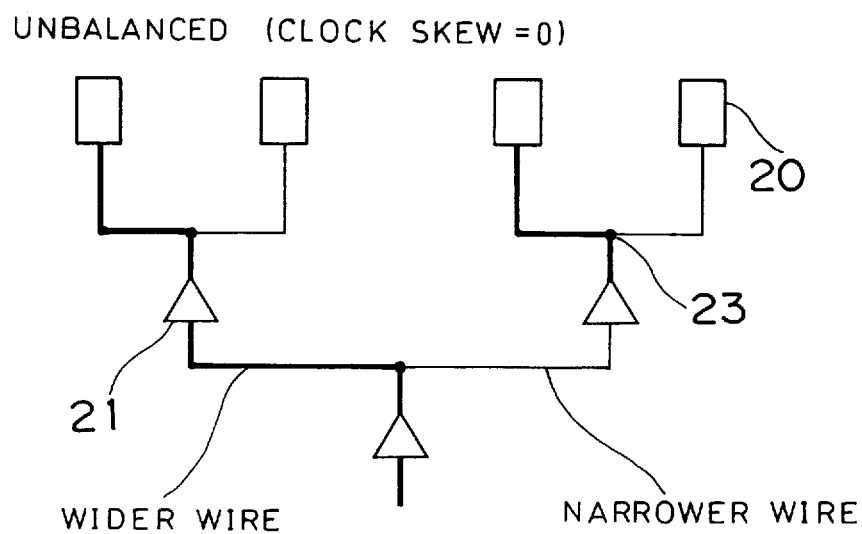

Since the global wiring in all the nets are determined through the foregoing steps, modification is made in the transistor size of a clock buffer 21, the wire width and the position of a tapping point 23 in step ST4, in order to accurately realize the desired clock skew value. Since the delay time of a wire can be obtained based on its capacitance and resistance, the change of clock skew can be adjusted by varying the wire width. Thus, the modification of a wire width can be used as means for adjusting a clock skew value. For example, in the case shown in FIG. 12a, the tapping points 23 are balanced, and the wires have the same width. In this case, the clock skew is obviously 0. In contrast, in the case shown in FIG. 12b, although the tapping points 23 are balanced, the wires having two different widths are used. In this case, since a wire with a larger width has a smaller resistance value, the delay time in a wider wire is shorter. Although the capacitance of a wider wire is longer, the increasing rate of the capacitance is smaller than the decreasing rate of the resistance value. Therefore, in the case of FIG. 12b, the clock skew value cannot be 0.

It is noted that the procedure in step ST4 is conducted in liaison with the calculation of the delay time in step ST12.

Figure 7B:
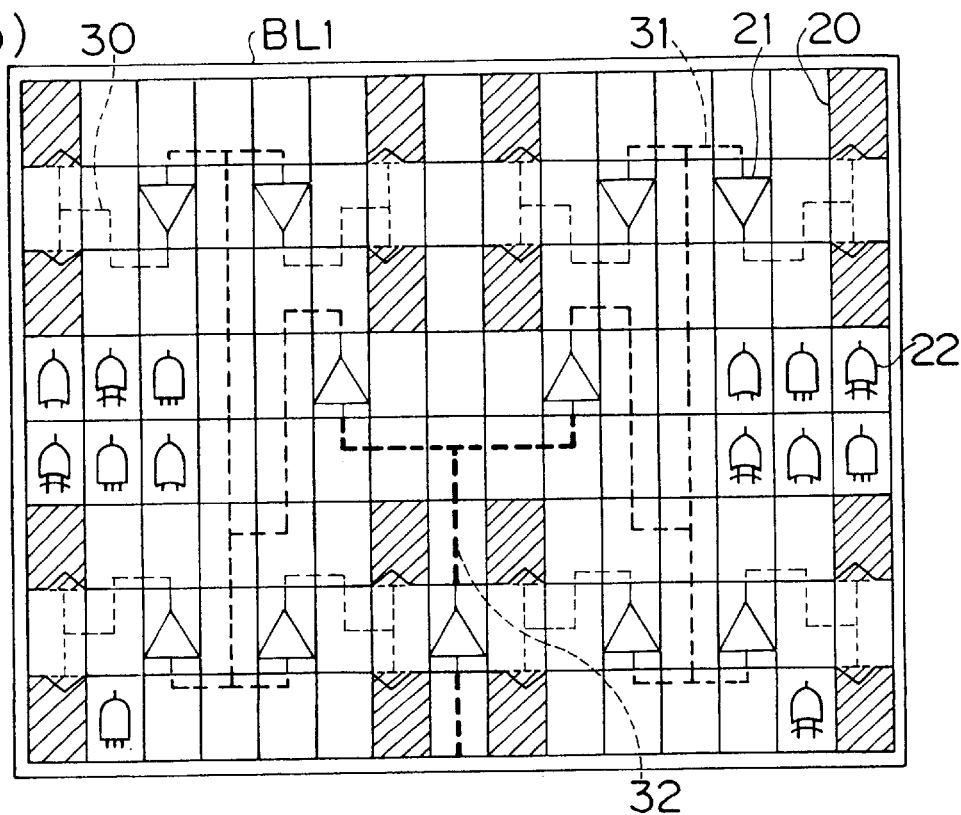

In substep ST4a of step ST4, the transistor size of a clock buffer 21 is changed, in substep ST4b the wire width is changed, and in substep ST4c the position of a tapping point 23 is changed. The positions of the tapping points 23 cannot be largely modified because the respective cells have been already laid out. Therefore, when the delay time is desired to be largely adjusted, the transistor sizes of the clock buffers 21 are varied. When the delay time is desired to be exactly adjusted, the wire width and the positions of the tapping points are varied. Through these substeps ST4a through ST4c, the clock skew value can be accurately adjusted. In the case of FIG. 7b, a wire 30 has a minimum width, a wire 31 has a slightly larger width, and a wire 32 has a width larger than the wire 31.

Next, all the nets are wired in step ST5. As described above, the procedure in step ST5 can be conducted by either of the above-mentioned methods (1) and (2).

When the method (1) is adopted, the clock net is wired mainly with one wiring layer in substep ST10a, and in substep ST10*b,* the other nets are wired with wiring layers that are not mainly used in substep ST10*a.* The clock net alone is thus wired in substep ST10*a* for the following reason: The clock net is constructed by varying the positions of the tapping points 23 and the widths of the wires 30, 31 and 32 based on the accurately calculated clock skew value in step ST4. However, when such a clock net is treated similarly to the other nets, it can be difficult to actually provide the wires as previously determined.

When the method (2) is adopted, all the nets are wired in substep ST11*a,* and then, in substep ST11*b,* the wire widths are varied again in the clock net alone in accordance with the clock skew value obtained in substep ST8*a.*

As is shown in FIG. 8, in this embodiment, the wire widths are determined according to the structures of the respective clock nets determined in step ST4. For example, the wires 30, 31 and 32 of FIG. 7*b* correspond to wires 33, 34 and 35 of FIG. 8, respectively.

Thus, the layout is completed.

According to this embodiment, since the structure of a clock tree is determined by using a template, the determination of the optimal positions of flip-flops and clock buffers and the adjustment of clock skew and delay time of each of the first type logic cells disposed on the clock tree can be flexibly and easily conducted as compared with the conventional method. As a result, the layout of a semiconductor LSI chip with a high clock frequency can be easily designed. Furthermore, since the structure of the clock tree is previously determined, the positions of the other logic cells can be easily optimized, and the congestion of the wires between the clock net and signal nets can be easily decreased.

In this embodiment, a block external clock net can be designed by using a clock tree or the logic cells can be disposed in the semiconductor integrated circuit without dividing it into the functional blocks.

[Embodiment 3]

Figure 13:
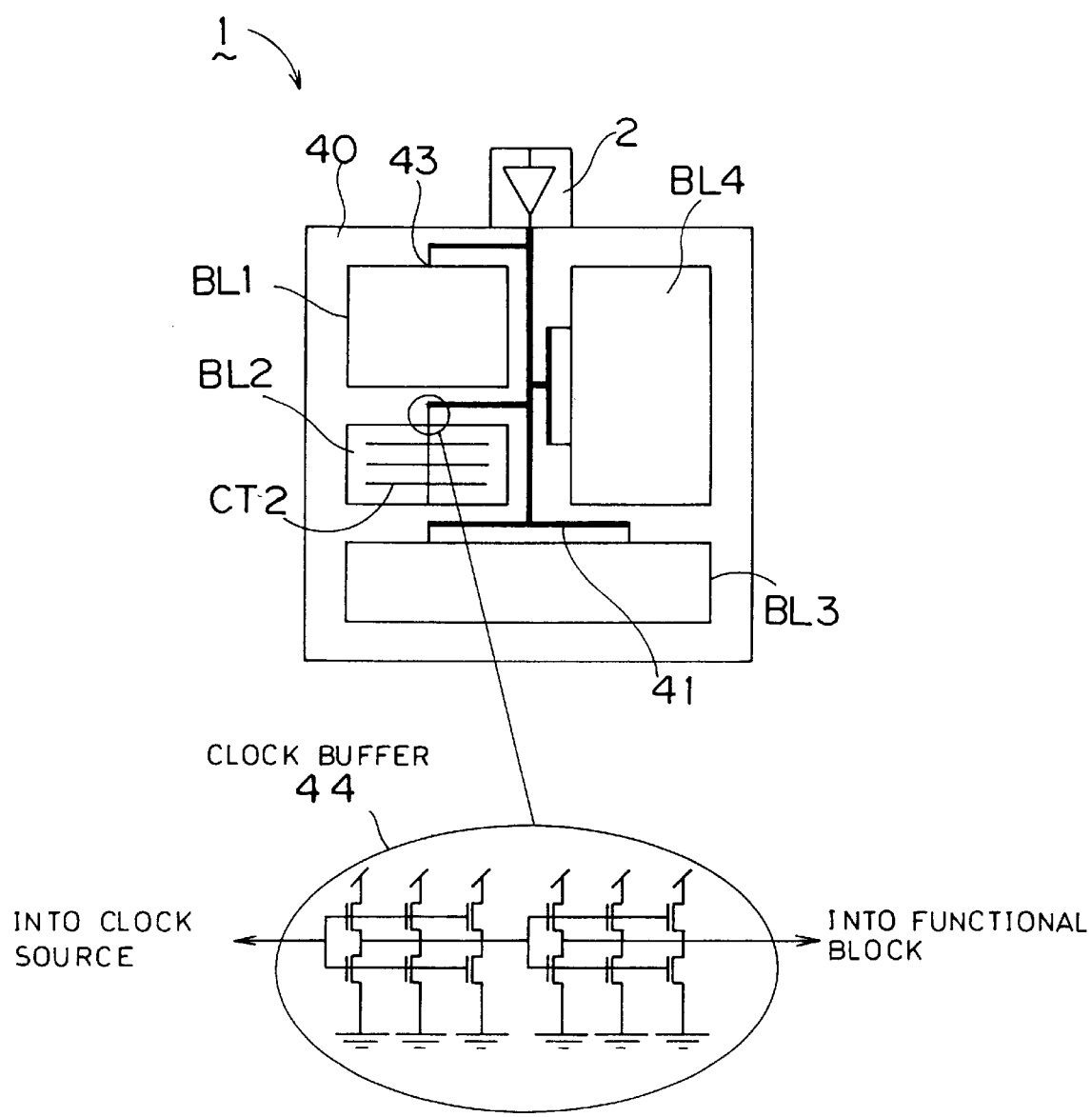
FIG. 13 is a schematic block diagram of the entire configuration of a semiconductor integrated circuit according to a third embodiment.

Embodiment 3 will now be described referring to FIGS. 13, 14 and 15*a* through 15*e.* FIG. 13 is a diagram showing the layout of a semiconductor integrated circuit 1 according to this embodiment. As is shown in FIG. 13, the semiconductor integrated circuit 1 includes four functional blocks BL1 through BL4 and a gate array region 40 where transistors are spread over. The semiconductor integrated circuit 1 is further provided with a clock source 2 for generating a clock signal at part of a pad. A clock signal is transferred through a block external clock wire 41 and supplied to each of the functional blocks BL1 through BL4 via a clock terminal 43 thereof. A clock buffer 44 is disposed between the block external clock wire 41 and each of the functional blocks BL1 through BL4. The clock buffer 44 is either obtained when a clock tree for forming the block external clock wire 41 is constructed or obtained as the root of each of clock trees CT1 through CT4 in the functional blocks BL1 through BL4. When the block external clock wire 41 is formed, wires are disposed so that a length between the clock source 2 to each clock buffer 44 be as equal as possible, in order to synchronize the clock signals supplied to the functional blocks BL1 through BL4 one another.

Since the clock buffer 44 is disposed outside of the functional blocks BL1 through BL4 in this embodiment, it is possible to change (resize) the transistor size of the clock buffer 44 dependently from the functional blocks BL1 through BL4. In the case where a clock buffer serving as the root of the clock tree is provided inside of each of the functional blocks BL1 through BL4, when the buffer size, i.e., the transistor size, of the clock buffer is desired to be resized for some reason after the completion of the layout of the functional blocks BL1 through BL4, it is necessary to re-lay out the functional blocks BL1 through BL4 in order to control the delay time to have desired values. Therefore, the number of procedures for the layout is increased. In contrast, when the clock buffer 44 is provided outside of the functional blocks BL1 through BL4 as in this embodiment, the delay time of the clock tree and the clock skew in the entire chip can be finely adjusted without re-laying out the functional blocks. Thus, it is possible to effectively prevent the increase of the number of the layout procedures.

As is shown in FIG. 13, which is an enlarged diagram of part of the clock buffer 44, the clock buffer 44 having a transistor size three times as large as a standard size is used in this embodiment.

In this embodiment, the clock buffer 44 is formed by using the transistors spread over the gate array region 40, but a gate area can be formed by using transistors provided to part of a wiring area adjacent to the functional blocks BL1 through BL4.

Figure 14:
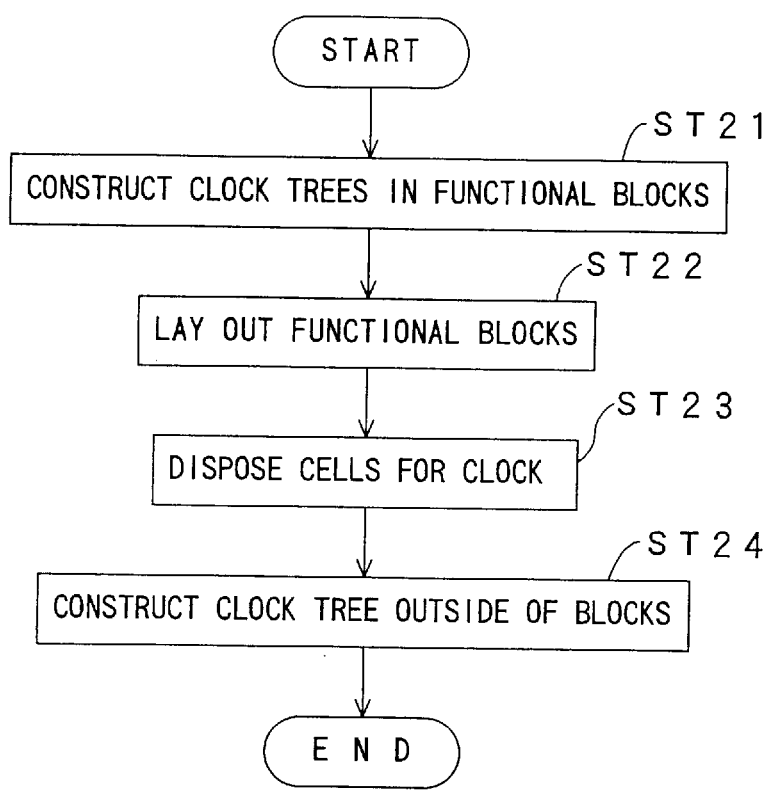
FIG. 14 is a flowchart illustrating layout design procedures according to the third embodiment.

Now, the layout designing method of this embodiment will be described referring to FIGS. 14 and 15*a* through 15*e.* FIG. 14 is a flowchart of the procedures for forming clock wires in the semiconductor integrated circuit 1 of FIG. 13. FIGS. 15*a* through 15*e* are exploded diagrams showing the change during the design of the semiconductor integrated circuit in accordance with the flowchart of FIG. 14.

In this embodiment, a chip (herein an embedded cell array LSI) of a semiconductor integrated circuit 1 including a clock source 2 at part of a pad, functional blocks BL1 through BL4 in which the layout is not designed, and a gate array region 40 corresponding to an area for block external wires will be exemplified.

Figure 15A:
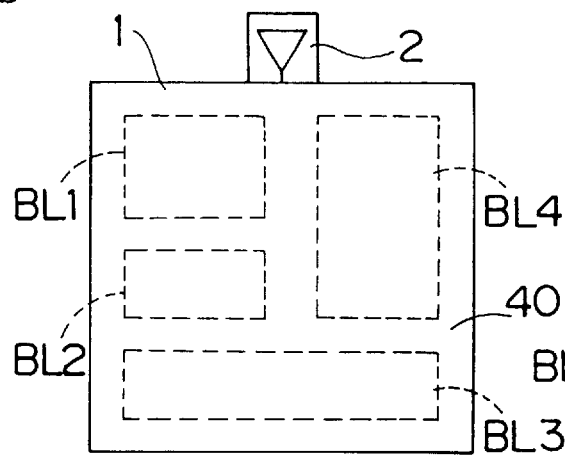
FIG. 15a through 15e are block diagrams of the layout design procedures according to the third embodiment illustrating the variation of the virtual configuration of the semiconductor integrated circuit.
Figure 15B:
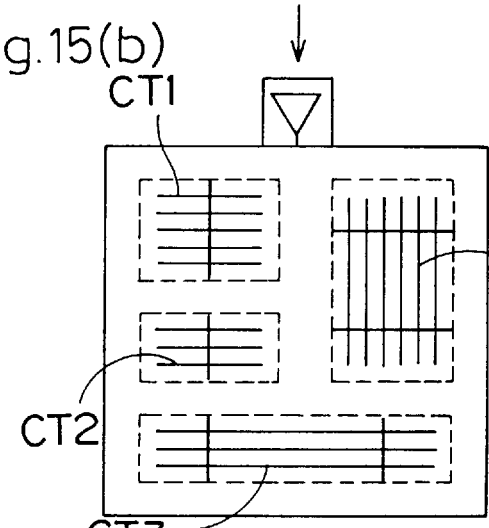

First, in step ST21, clock trees CT1 through CT4 for forming clock nets are constructed in the four functional blocks BL1 through BL4 in which the layout is not completed, as is shown in FIG. 15*b.* Then, the layout is completed together with that in another net excluding the clock net. When the clock trees CT1 through CT4 are constructed, clock buffers corresponding to the roots of the clock trees are disposed not in the functional blocks BL1 through BL4 but in the gate array region 40.

Figure 15C:
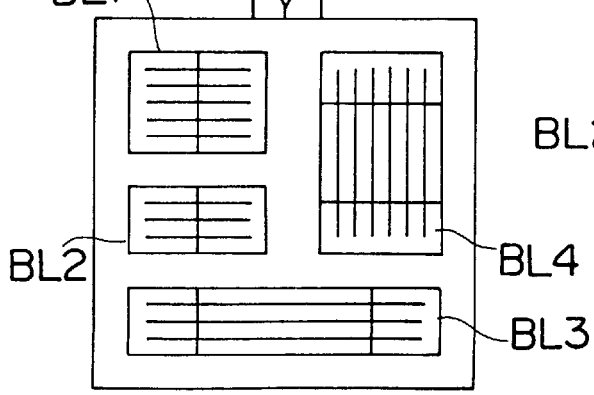

Next, in step ST22, the functional blocks BL1 through BL4 are laid out in the semiconductor integrated circuit 1 as is shown in FIG. 15*c.*

At this stage, it is possible to conduct the procedure in step ST22 before conducting that in step ST21. In this case, since the functional blocks BL1 through BL4 in which the layout is not completed are disposed in step ST22, merely rough positions of the blocks are determined.

Figure 15D:
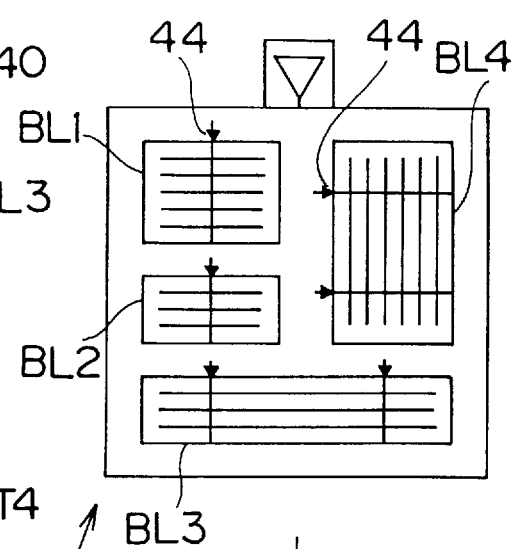
Figure 15E:
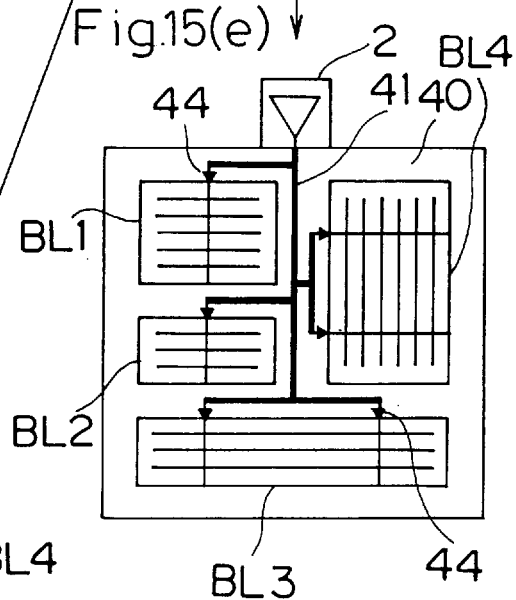
Figure 16A:
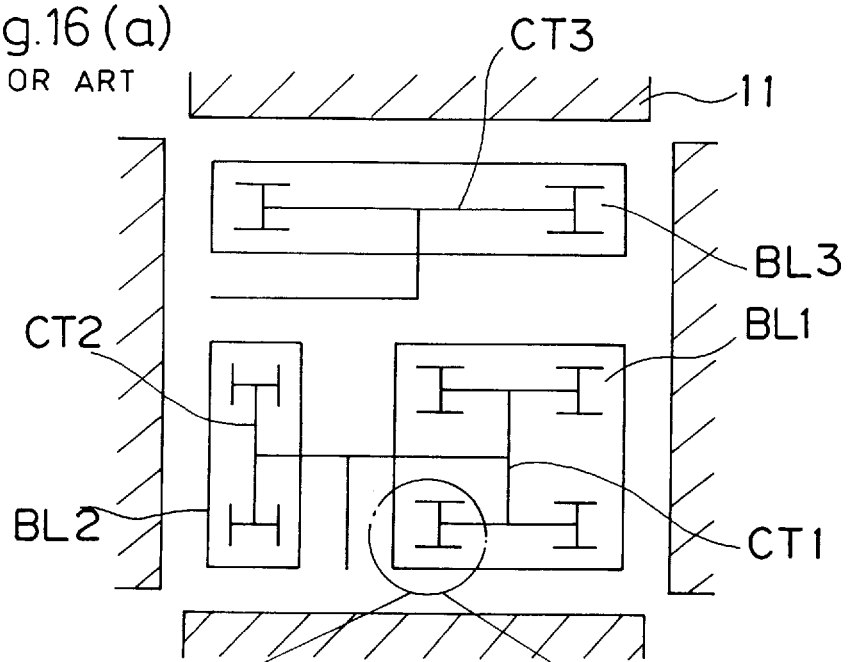
FIGS. 16a and 16b are block diagrams illustrating the schematic configuration and the construction of a clock tree in a semiconductor integrated circuit, respectively.
Figure 16B:
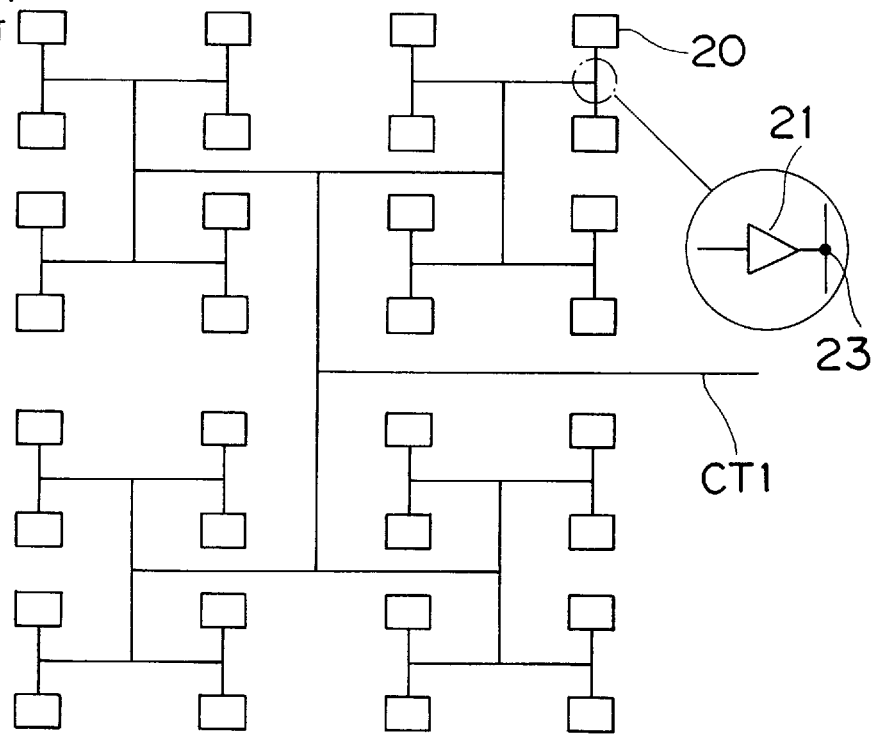

Then, the clock buffers 44 are disposed adjacent to the functional blocks BL1 through BL4 as is shown in FIG. 15*d* in step ST23. The clock buffers 44 are positioned at points corresponding to the roots of the clock trees CT1 through CT4 in the functional blocks BL1 through BL4 constructed in step ST22. The transistor size of each clock buffer 44 depends upon a required driving ability, which is estimated in constructing the clock trees CT1 through CT4. In this example, since the block external area corresponds to the gate array region 40, the clock buffers 44 can be positioned at any optional points.

Finally, a clock tree outside of the blocks is constructed and a block external clock wire 41 is formed in step ST24. The block external clock wire 41 shown in the drawing results from tapering (i.e., varying the wire width in a stepwise manner). The tapering is effective means in electromigration and optimization of a clock delay time value. Furthermore, the block external clock wire 41 is formed so as to minimize the clock skew from the clock source 2 to each clock buffer 44. At this point, transistors of the clock buffers 44 can be resized in order to exactly adjust the clock skew in the entire chip. In this case, since the clock buffers 44 are disposed outside of the functional blocks BL1 through BL4, it is obviously possible to exactly adjust the clock skew in the entire chip by resizing the transistors of the clock buffers 44.

We/I claim:

1. A method of designing a layout of a semiconductor integrated circuit including a plurality of functional blocks each of which includes a plurality of cells each including at least one element, the plurality of cells being classified into a first type of cells receiving a clock signal and a second type of cells not receiving a clock signal, the method comprising the steps of:

a first step of approximately laying out the functional blocks in the semiconductor integrated circuit;

a second step of approximately laying out block external wiring from a first clock input port of the semiconductor integrated circuit to second clock input ports of the functional blocks, by approximately determining a block external delay time of the clock signal for each functional block, the block external delay time representing the delay time from the first clock input sort to the second clock input port of a given functional block;

a third step of sequentially determining the layout of the first type of cells, the layout of the second type of cells, block internal wiring and the block external wiring in this order, by calculation of a total delay time of the clock signal for each of the first type of cells which is a sum of the block external delay time from the first clock input port to each second clock input port of each of the functional blocks and block internal delay time, which is the delay time from the second clock input port to each of the first type of cells, so that a clock skew defined as a difference in the delay time among the first type of cells is within a a first predefined range and that the total delay time of each of the first type of cells is within a second predefined range; and a fourth step of forming wiring patterns in accordance with the wiring determined in the third step.

2. The method of designing a layout of a semiconductor integrated circuit of claim 1, wherein only part of the block external wiring corresponding to a portion up to a final branching point from which the functional blocks are directly branched is approximately determined in the second step, and the method is further provided with a step, between the third and fourth steps, of correcting layout positions of the functional blocks.

3. The method of designing layout of a semiconductor integrated circuit of claim 1, wherein the delay time of the respective cells are distributed to have a plurality of different values within the desired range in the third step.

4. The method of designing a layout of a semiconductor integrated circuit of claim 1, wherein the third step comprises the steps of:

forming a template corresponding to a clock tree having such a structure that a wire led from the second clock input port of each of the functional blocks is successively branched in a plurality of directions to ultimately reach each of the first type of cells;

disposing the first type of cells in each of the functional blocks based on the structure of the clock tree, and disposing the second type of cells in a space area excluding an area where the first type of cells are disposed;

approximately determining wiring among the cells in accordance with a logical interconnecting demand;

adjusting the delay time from the second input port to each of the first type of cells on the clock tree to ultimately have a desired value; and forming wiring patterns in the functional blocks in accordance with the wiring determined in the previous step.

5. The method of designing layout of a semiconductor integrated circuit of claim 4, wherein the step of forming the template comprises the steps of:
determining a number of branching in the clock tree;
determining a size of the clock tree;
determining positions of tapping points on the clock tree; and
laying out cells for adjusting delay time on the clock tree.

6. The method of designing layout of a semiconductor integrated circuit of claim 4, wherein the step of adjusting the delay time of each of the first type of cells is conducted by varying at least one of an output driving ability of a cell for adjusting delay time located at an internal node on the clock tree, a width of a wire on the clock tree, and a position of a tapping point on the clock tree.

7. The method of designing a layout of a semiconductor integrated circuit of claim 1, further comprising a step of laying out a cell for adjusting block external delay time so as to be positioned previously to each second clock input port and outside of the functional blocks.

8. A method of designing a layout of a semiconductor integrated circuit including a plurality of functional blocks each including a plurality of cells each including at least one element, the plurality of cells being classified into a first type of cells receiving a clock signal from a clock input port and a second type of cells not receiving a clock signal the method comprising the steps of:

forming a template corresponding to a clock tree having such a structure that a wire led from the clock input port is successively branched in a plurality of directions to ultimately reach each of the first type of cells;

disposing the first type of cells in the semiconductor integrated circuit based on the structure of the clock tree constructed in the previous step, and disposing the second type of cells in a space area excluding an area where the first type of cells are disposed;

approximately determining wiring among the cells in accordance with a logical interconnecting demand;

adjusting delay time from the clock input port to each of the first type of cells on the clock tree to ultimately have a desired value; and forming wiring patterns in the semiconductor integrated circuit in accordance with the wiring determined in the previous step.

9. The method of designing layout of a semiconductor integrated circuit of claim 8, wherein the step of forming the template comprises the steps of:
determining a number of branching in the clock tree;
determining a size of the clock tree;
determining positions of tapping points on the clock tree; and laying out cells for adjusting delay time on the clock tree.

10. The method of designing layout of a semiconductor integrated circuit of claim 8, wherein the step of adjusting the delay time of each of the first type of cells is conducted by varying at least one of an output driving ability of a cell located at an internal node on the clock tree, a width of a wire in the clock tree, and a position of a tapping point on the clock tree.

11. The method of designing a layout of a semiconductor integrated circuit of claim 8, wherein, during the step of forming the template, delay time of a clock signal from the clock input port to each of the first type of cells is calculated, and the template is formed so that the delay time of all the first type of cells are within a desired range.

12. The method of designing a layout of a semiconductor integrated circuit of claim 8, wherein, during the step of ultimately adjusting the delay time, delay time of clock signals from the clock input port to the first type of cells are substantially equally distributed to have a plurality of different values within a desired range.

13. The method of designing a layout of a semiconductor integrated circuit of claim 8, wherein, during the step of disposing the cells, flip-flops are laid out at respective tips of the clock tree as the first type of cells, cells for adjusting delay time are disposed at internal nodes between the tapping points on the clock tree as the first type of cells, and then, the second type of cells are laid out.

14. A method of designing a layout of a semiconductor integrated circuit including a plurality of functional blocks each including a plurality of cells each including at least one element, the plurality of cells being classified into a first type of cells receiving a clock signal and a second type of cells not receiving a clock signal, the method comprising the steps of:

forming a block internal clock net in each of the functional blocks;

disposing cells for adjusting delay time so as to be positioned previously to second clock input ports for supplying the functional blocks with clock signals and outside of the functional blocks;

disposing the functional blocks in the semiconductor integrated circuit; and forming a block external clock net extending from a first clock input port of the semiconductor integrated circuit to the second clock input ports of the functional blocks through the cells for adjusting the delay time.

15. The method of designing layout of a semiconductor integrated circuit of claim 14, wherein the step of forming the block internal clock net comprises the steps of:

forming a template corresponding to a clock tree having such a structure that a wire led from the clock input port of each of the functional blocks is successively branched in a plurality of directions to ultimately reach each of the first type of cells;

disposing the first type of cells in the functional blocks in accordance with the structure of the clock tree and disposing the second type of cells in a space area in the functional blocks excluding the area where the first type of cells are disposed;

approximately determining wiring among the cells in accordance with a logical interconnecting demand;

adjusting delay time from the second clock input port to each of the first type of cells on the clock tree to ultimately have a desired value; and forming wiring patterns in the functional blocks in accordance with the wiring determined in the previous step.

* * * * *

UNITED STATES PATENT AND TRADEMARK OFFICE
CERTIFICATE OF CORRECTION

PATENT NO. : 5,774,371
DATED : June 30, 1998
INVENTOR(S) : Yoshiyuki KAWAKAMI

It is certified that error appears in the above-identified patent and that said Letters Patent is hereby corrected as shown below:

Col. 19, line 25: Change "sort" to --port--

Signed and Sealed this

Twenty-seventh Day of October, 1998

Attest:

BRUCE LEHMAN

*Attesting Officer*     *Commissioner of Patents and Trademarks*